(12) United States Patent
Smith et al.

(10) Patent No.: US 9,663,718 B2
(45) Date of Patent: May 30, 2017

(54) METHOD OF PREPARING A BIREFRINGENT POLYMER FILM

(71) Applicant: Merck Patent GmbH, Darmstadt (DE)

(72) Inventors: Graham Smith, Chilworth (GB);
Owain Llyr Parri, Ringwood (GB);
Sarah Whitehouse, Southampton (GB);
Tara Perrett, Bournemouth (GB)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 15/030,747

(22) PCT Filed: Oct. 1, 2014

(86) PCT No.: PCT/EP2014/002678
§ 371 (c)(1),
(2) Date: Apr. 20, 2016

(87) PCT Pub. No.: WO2015/058832
PCT Pub. Date: Apr. 30, 2015

(65) Prior Publication Data
US 2016/0244671 A1    Aug. 25, 2016

(30) Foreign Application Priority Data

Oct. 21, 2013  (EP) .................................... 13005019

(51) Int. Cl.
*G02B 5/30* (2006.01)
*C09K 19/38* (2006.01)
(Continued)

(52) U.S. Cl.
CPC .......... *C09K 19/3852* (2013.01); *C09K 19/54* (2013.01); *C09K 19/588* (2013.01);
(Continued)

(58) Field of Classification Search
CPC .. C09K 19/3852; C09K 19/54; C09K 19/588; C09K 2219/03; G02B 5/3016; G02B 5/3083; G03F 7/0005; G03F 7/2002
(Continued)

(56) References Cited

U.S. PATENT DOCUMENTS 7,597,942 B2  10/2009  May et al.
7,724,330 B2   5/2010  Parri et al.
(Continued)

FOREIGN PATENT DOCUMENTS

EP    2 108 691 A1 * 10/2009
WO    2006/002765 A1   1/2006
(Continued)

OTHER PUBLICATIONS

International Search Report dated Jan. 14, 2015 issued in corresponding PCT/EP2014/002678 application (pp. 1-4).
Written Opinion of the International Searching Authority dated Jan. 14, 2015 issued in corresponding PCT/EP2014/002678 application (pp. 1-10).

*Primary Examiner* — John A McPherson
(74) *Attorney, Agent, or Firm* — Millen, White, Zelano and Branigan, P.C.

(57) ABSTRACT

The invention relates to a method of preparing a polymer film and to the use of such polymer film as in liquid crystal displays (LCDs) or other optical or electro optical devices, for decorative or security applications, as alignment layer or optical retardation film.

20 Claims, 5 Drawing Sheets

(51) Int. Cl.
  *G03F 7/00* (2006.01)
  *C09K 19/54* (2006.01)
  *C09K 19/58* (2006.01)
  *G03F 7/20* (2006.01)
  *C09K 19/04* (2006.01)
  *C09K 19/20* (2006.01)
  *C09K 19/34* (2006.01)

(52) U.S. Cl.
  CPC ......... *G02B 5/3016* (2013.01); *G02B 5/3083* (2013.01); *G03F 7/0005* (2013.01); *C09K 2019/0448* (2013.01); *C09K 2019/2035* (2013.01); *C09K 2019/2078* (2013.01); *C09K 2019/2092* (2013.01); *C09K 2019/3433* (2013.01); *C09K 2219/03* (2013.01); *G03F 7/2002* (2013.01)

(58) Field of Classification Search
  USPC .......................................................... 430/321
  See application file for complete search history.

(56) References Cited

U.S. PATENT DOCUMENTS

| | | |
|---|---|---|
| 8,455,563 B2 | 6/2013 | Parri et al. |
| 2007/0258024 A1 | 11/2007 | Parri et al. |
| 2008/0055521 A1* | 3/2008 | Mizutani ............... G02B 5/3016 349/96 |
| 2008/0143943 A1 | 6/2008 | May et al. |
| 2008/0203356 A1* | 8/2008 | Kjellander ............... G02B 1/04 252/299.01 |
| 2011/0178200 A1 | 7/2011 | Parri et al. |
| 2015/0166892 A1* | 6/2015 | Gardiner ............... C09K 19/3852 524/548 |
| 2015/0322345 A1 | 11/2015 | Sargent |

FOREIGN PATENT DOCUMENTS

| | | |
|---|---|---|
| WO | 2006/027076 A1 | 3/2006 |
| WO | 2009/086911 A1 | 7/2009 |
| WO | 2014/000846 A1 | 1/2014 |
| WO | 2014/090369 A1 | 6/2014 |

* cited by examiner

METHOD OF PREPARING A BIREFRINGENT POLYMER FILM

FIELD OF INVENTION

The invention relates to a method of preparing a polymer film the film as such and to the use of such polymer film in liquid crystal displays (LCDs) or other optical or electro optical devices, for decorative or security applications, for window applications, as alignment layer or optical retardation film.

BACKGROUND AND PRIOR ART

Usually, reactive mesogen layers require an alignment layer or rubbed plastic substrate to align in the planar state. In this regard, two main methods are currently used in the display industry to align liquid crystals for optical film applications:

(i) Rubbing process, wherein a plastic substrate or alignment layer is rubbed in one direction providing alignment direction for coated liquid crystals. The alignment quality varies depending on the rubbing process and the properties of the substrate or film. The rubbing process is difficult to optimise and can produce variable results. Furthermore, the rubbing process is considered an unfavourable process by LCD producers because it can produce particles that are difficult to control in high-class clean rooms.

(ii) Photoalignment process, as described in U.S. Pat. No. 7,364,671 B2, wherein a photo-orientable monomer, oligomer or polymer is photo-oriented while maintaining conditions that the polymerization or cross-linking of the polymerizable liquid-crystalline material is essentially inhibited. The photoalignment and polymerization step are carried out in two different steps and under different conditions. Accordingly, such photoaligning layers can be difficult to prepare due to the requirements that the production conditions have to be adjusted concerning the individual composition of various liquid-crystalline materials. In addition, an annealing step is usually required to allow liquid crystals to align fully. Consequently, photoaligning layers following this process are expensive.

Therefore, there is still the need for alternative production methods, which do not have the drawbacks of prior art methods or have them to a lesser extent.

One aim of the present invention is to provide a one-step method of production for a polymer film, which
a) is in particular suitable for mass production, and
b) is applicable for a broad range of polymerizable liquid-crystalline materials,
c) does not require an alignment layer like e.g. rubbed polyimide layer,
d) allows patterning,
e) allows overcoating a chosen layer without the need for an extra alignment layer,
f) allows the production of thick films with a non-uniform alignment, and
g) allows the production of concave or convex flat type polymer lenses.

Other aims of the present invention are immediately evident to the person skilled in the art from the following detailed description.

SUMMARY OF THE INVENTION

Surprisingly, the inventor have found that one or more of the above-described problems can be solved by the method of preparing a polymer film according to the present invention, which comprises the following steps:

a) providing a layer of a polymerizable liquid-crystalline material comprising at least one dichroic photoinitiator, and at least one chiral compound, onto a substrate, b) adjusting the temperature of the polymerizable liquid-crystalline material to a temperature, where the polymerizable liquid-crystalline material is in its nematic or isotropic phase, c) polymerizing and orientating by irradiating the polymerizable liquid-crystalline material with linear polarized actinic radiation, whereby the angle between the layer of the polymerizable liquid-crystalline material, the direction of the electric field vector of the linear polarised actinic radiation is varied, thereby causing the polymerizable liquid-crystalline material to form a polymer film, and d) optionally removing the polymer film from the substrate.

Advantageously, the method according to the present invention removes the need for an alignment layer or rubbing process. The polymer films can be created on many different substrates (e.g. plain glass, colour filters, plastic substrates) without further treatment of the polymerizable liquid-crystalline material. The curing can be performed in the isotropic phase or even in the nematic phase of the polymerizable liquid crystalline material. Typical temperature ranges are, for example, in the range from about 150° C. below to about 75° C. above the corresponding clearing point, preferably in the range from about 100° C. below to about 60° C. above the corresponding clearing point, more preferably in the range from about 75° C. below to about 50° C. above the corresponding clearing point, but in all cases, with the proviso that the liquid crystalline material is either in its nematic or its isotropic phase. A chiral compound and a polarisation state sensitive photoinitiator are required in combination with linear polarised actinic radiation to induce e.g. planar or tilted alignment in the resultant optical film. The process of making such a polymer film can be completed in one-step by linear polarised actinic radiation, producing e.g. unique patterned polymer films exhibiting at least two different orientations of the director of the liquid crystals.

The invention further relates to a polymer film obtainable from a method as described above and below.

The invention further relates to the use of polymer film as described above and below in liquid crystal displays (LCDs) or other optical or electrooptical devices, for decorative or security applications, for window applications, as alignment layer or optical retardation film.

Said optical and electro optical devices include, without limitation electrooptical displays, liquid crystal displays (LCDs), polarisers, compensators, beam splitters, reflective films, alignment films, 3D film, such as lenticular arrays, lenses, colour filters, holographic elements, hot stamping foils, coloured images, decorative or security markings, liquid-crystalline pigments, adhesive layers, non-linear optic (NLO) devices, and optical information storage devices.

The invention further relates to a compensator comprising at least one polymer film as described above and below, in particular patterned A plate and C plate compensators, and tilted variants of these compensators. The invention further relates to an optical or electro-optical device comprising at least one polymer film as described above and below.

Terms and Definitions

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts, and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

The term "polymerization" means the chemical process to form a polymer by bonding together multiple polymerizable groups or polymer precursors (polymerizable compounds) containing such polymerizable groups.

The terms "film" and "layer" include rigid or flexible, self-supporting or freestanding films with mechanical stability, as well as coatings or layers on a supporting substrate or between two substrates.

The term "liquid crystal (LC)" relates to materials having liquid crystalline mesophases in some temperature ranges (thermotropic LCs) or in some concentration ranges in solutions (lyotropic LCs). They obligatorily contain mesogenic compounds.

The terms "mesogenic compound" and "liquid crystal compound" mean a compound comprising one or more calamitic (rod- or board/lath-shaped) or discotic (disk-shaped) mesogenic groups. The term "mesogenic group" means a group with the ability to induce liquid crystalline phase (or mesophase) behaviour.

The compounds comprising mesogenic groups do not necessarily have to exhibit a liquid-crystalline mesophase themselves. It is also possible that they show liquid-crystalline mesophases only in mixtures with other compounds, or when the mesogenic compounds or materials, or the mixtures thereof, are polymerized. This includes low-molecular-weight non-reactive liquid-crystalline compounds, reactive or polymerizable liquid-crystalline compounds, and liquid-crystalline polymers.

A calamitic mesogenic group is usually comprising a mesogenic core consisting of one or more aromatic or non-aromatic cyclic groups connected to each other directly or via linkage groups, optionally comprising terminal groups attached to the ends of the mesogenic core, and optionally comprising one or more lateral groups attached to the long side of the mesogenic core, wherein these terminal and lateral groups are usually selected e.g. from carbyl or hydrocarbyl groups, polar groups like halogen, nitro, hydroxy, etc., or polymerizable groups.

The term "reactive mesogen" means a polymerizable mesogenic or liquid crystal compound, preferably a monomeric compound. These compounds can be used as pure compounds or as mixtures of reactive mesogens with other compounds functioning as photoinitiators, inhibitors, surfactants, stabilizers, chain transfer agents, non-polymerizable compounds, etc.

Polymerizable compounds with one polymerizable group are also referred to as "monoreactive" compounds, compounds with two polymerizable groups as "direactive" compounds, and compounds with more than two polymerizable groups as "multireactive" compounds. Compounds without a polymerizable group are also referred to as "non-reactive or non-polymerizable "compounds.

The term "chiral" in general is used to describe an object that is non-superimposable on its mirror image. "Achiral" (non-chiral) objects are objects that are identical to their mirror image.

The pitch induced by the chiral substance ($P_0$) is in a first approximation inversely proportional to the concentration (c) of the chiral material used. The constant of proportionality of this relation is called the helical twisting power (HTP) of the chiral substance and defined by equation (1)

$$HTP=1/(c \cdot P_0) \qquad (1)$$

wherein (c) is the concentration of the chiral compound.

As with the common photoinitiators, a "dichroic photoinitiator" dissociates when exposed to the correct wavelength. In fact, at least two radicals are formed, from which at least one is capable to initiate polymerisation of monomers. The dichroic photoinitiator has the property that the light absorption is dependent on the molecular orientation of the molecule. The dichroic photoinitiators selectively dissociate when aligned with the electric field vector of the incoming light.

Linear polarized light is understand to mean light in the form of a transverse wave having a confinement of the electric field vector or magnetic field vector to a given plane along the direction of propagation. The orientation of a linearly polarized light is defined by the direction of the electric field vector. For example, if the electric field vector is vertical (alternately up and down as the wave travels) the radiation is said to be vertically polarized.

Visible light is electromagnetic radiation that has wavelength in a range from about 400 nm to about 740 nm. Ultraviolet (UV) light is electromagnetic radiation with a wavelength in a range from about 200 nm to about 450 nm.

The Irradiance ($E_e$) or radiation power is defined as the power of electromagnetic radiation (dθ) per unit area (dA) incident on a surface:

$$E_e = d\theta/dA \qquad (2)$$

The radiant exposure or radiation dose ($H_e$), is as the irradiance or radiation power ($E_e$) per time (t):

$$H_e = E_e \cdot t. \qquad (3)$$

All temperatures, such as, for example, the melting point T(C,N) or T(C,S), the transition from the smectic (S) to the nematic (N) phase T(S,N) and the clearing point T(N,I) of the liquid crystals, are quoted in degrees Celsius. All temperature differences are quoted in differential degrees. The term "clearing point" means the temperature at which the transition between the mesophase with the highest temperature range and the isotropic phase occurs.

The term "director" is known in prior art and means the preferred orientation direction of the long molecular axes (in case of calamitic compounds) or short molecular axes (in case of discotic compounds) of the liquid-crystalline or RM molecules. In case of uniaxial ordering of such anisotropic molecules, the director is the axis of anisotropy.

The term "alignment" or "orientation" relates to alignment (orientational ordering) of anisotropic units of material such as small molecules or fragments of big molecules in a common direction named "alignment direction". In an aligned layer of liquid-crystalline or RM material the liquid-crystalline director coincides with the alignment direction so that the alignment direction corresponds to the direction of the anisotropy axis of the material.

The terms "uniform orientation" or "uniform alignment" of an liquid-crystalline or RM material, for example in a layer of the material, mean that the long molecular axes (in case of calamitic compounds) or the short molecular axes (in case of discotic compounds) of the liquid-crystalline or RM molecules are oriented substantially in the same direction. In other words, the lines of liquid-crystalline director are parallel.

The term "planar orientation/alignment", for example in a layer of an liquid-crystalline or RM material, means that the long molecular axes (in case of calamitic compounds) or the short molecular axes (in case of discotic compounds) of the liquid-crystalline or RM molecules are oriented substantially parallel to the plane of the layer.

The term "tilted orientation/alignment", for example in a layer of an liquid-crystalline or RM material, means that the long molecular axes (in case of calamitic compounds) or the short molecular axes (in case of discotic compounds) of the liquid-crystalline or RM molecules are oriented at an angle θ ("tilt angle") between 0 and 90° relative to the plane of the layer.

The birefringence Δn is defined as follows $$\Delta n = n_e - n_o \qquad (4)$$

wherein $n_e$ is the extraordinary refractive index and $n_o$ is the ordinary refractive index, and the average refractive index $n_{av.}$ is given by the following equation:

$$n_{av.} = ((2n_o^2 + n_e^2)/3)^{1/2} \qquad (5)$$

The average refractive index $n_{av.}$ and the ordinary refractive index $n_o$ can be measured using an Abbe refractometer. Δn can then be calculated from the above equations.

In case of doubt the definitions as given in C. Tschierske, G. Pelzl and S. Diele, Angew. Chem. 2004, 116, 6340-6368 shall apply.

DETAILED DESCRIPTION

In a preferred embodiment, the polymerizable liquid-crystalline material used for the method according to the present invention comprises at least one mono-, di- or multireactive polymerizable mesogenic compound, at least one chiral compound, and at least one dichroic photoinitiator.

In another preferred embodiment, the polymerizable liquid-crystalline material used for the method according to the present invention comprises at least one monoreactive polymerizable mesogenic compound, at least one di- or multireactive polymerizable mesogenic compound, at least one chiral compound, and at least one dichroic photoinitiator.

In a further preferred embodiment, the polymerizable liquid-crystalline material used for the method according to the present invention comprises at least one monoreactive chiral polymerizable mesogenic compound, at least one mono-, di- or multireactive achiral polymerizable mesogenic compound, and at least one dichroic photoinitiator.

In particular, the polymerizable liquid-crystalline material used for the method according to the present invention comprises at least one di- or multireactive chiral polymerizable mesogenic compound, at least one mono-, di- or multireactive achiral polymerizable mesogenic compound, and at least one dichroic photoinitiator.

It is likewise preferred, that the polymerizable liquid-crystalline material comprises at least one non-polymerizable chiral compound, at least one mono-, di- or multireactive achiral polymerizable mesogenic compound and at least one dichroic photoinitiator.

All known dichroic photoinitiators are suitable for the method according to the present invention, preferably dichroic photoinitiators comprising an α-amino group as disclosed in EP 1 388 538 A1 are used. Especially preferred are dichroic photoinitiators of formula I,

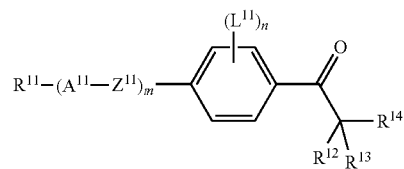

wherein
P is a polymerizable group,
Sp is a spacer group or a single bond,
$A^{11}$ is in case of multiple occurrence independently of one another an aryl-, heteroaryl-, aliphatic or heterocyclic group optionally being substituted by one or more identical or different groups L,
$Z^{11}$ is in each occurrence independently from each other, —O—, —S—, —CO—, —COO—, —OCO—, —S—CO—, —CO—S—, —O—COO—, —CO—NR$^{01}$—, —NR$^{01}$—CO—, —NR$^{01}$—CO—NR$^{02}$, —NR$^{01}$—CO—O—, —O—CO—NR$^{01}$—, —OCH$_2$—, —CH$_2$O—, —SCH$_2$—, —CH$_2$S—, —CF$_2$O—, —OCF$_2$—, —CF$_2$S—, —SCF$_2$—, —CH$_2$CH$_2$—, —(CH$_2$)$_4$—, —CF$_2$CH$_2$—, —CH$_2$CF$_2$—, —CF$_2$CF$_2$—, —CH═N—, —N═CH—, —N═N—, —CH═CR$^{01}$—, —CY$^{01}$═CY$^{02}$—, —C≡C—, —CH═CH—COO—, —OCO—CH═CH—, or a single bond,
m is 0, 1, 2 or 3,
r is 0, 1, 2, 3 or 4,
L is, in case of multiple occurrence independently of one another, H, halogen, CN or optionally or straight chain or branched alkyl with 1 to 5 C-atoms that is optionally mono- or polysubstituted by halogen or CN, and wherein one or more non-adjacent CH$_2$ groups are optionally replaced, in each case independently from one another, by —O—, —S—, —NR$^{01}$—, —SiR$^{01}$R$^{02}$—, —CO—, —COO—, —OCO—, —OCO—O—, —NR$^{01}$—, CO—, —CO—NR$^{01}$—, —NR$^{01}$—CO—NR$^{02}$—, —S—CO—, —CO—S—, —CY$^{01}$═CY$^{02}$— or —C≡C— in such a manner that O and/or S atoms are not linked directly to one another,
$R^{11}$ is H, halogen, CN, NO$_2$, NCS, SF$_5$, P-Sp-; or straight chain or branched alkyl with 1 to 20 C-atoms that is optionally mono- or polysubstituted by halogen or CN, and wherein one or more non-adjacent CH$_2$ groups are optionally replaced, in each case independently from one another, by —O—, —S—, —NR$^{01}$—, —SiR$^{01}$R$^{02}$—, —CO—, —COO—, —OCO—, —OCO—O—, —NR$^{01}$—CO—, —CO—NR$^{01}$—, —NR$^{01}$—CO—NR$^{02}$—, —S—CO—, —CO—S—, —CY$^{01}$═CY$^{02}$— or —C≡C— in such a manner that O and/or S atoms are not linked directly to one another; or R$^{14}$
$R^{12-13}$ are independently of each other H, or straight chain or branched alkyl with 1 to 5 C-atoms that is optionally mono- or polysubstituted by halogen or CN, and wherein one or more non-adjacent CH$_2$ groups are optionally replaced, in each case independently from one another, by —O—, —S—, —NR$^{01}$—, —SiR$^{01}$R$^{02}$—, —CO—, —COO—, —OCO—, —OCO—O—, —NR$^{01}$—CO—, —CO—NR$^{01}$—, —NR$^{01}$—CO—NR$^{02}$—, —S—CO—, —CO—S—, —CY$^{O1}$=CY$^{O2}$— or —C≡C— in such a manner that O and/or S atoms are not linked directly to one another, R$^{14}$ denotes —OH, —NR$^{O1}$R$^{O2}$, or

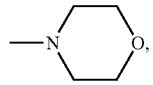

Y$^{O1}$ and Y$^{O2}$ each, independently of one another, denote H, halogen or CN, and R$^{O1}$ and R$^{O2}$ are in dependently of each other H, or straight chain or branched alkyl with 1 to 5 C-atoms.

Above and below, "carbyl group" denotes a mono- or polyvalent organic group containing at least one carbon atom which either contains no further atoms (such as, for example, —C≡C—) or optionally contains one or more further atoms, such as, for example, N, O, S, P, Si, Se, As, Te or Ge (for example carbonyl, etc.). "Hydrocarbyl group" denotes a carbyl group, which additionally contains one or more H atoms and optionally one or more heteroatoms, such as, for example, N, O, S, P, Si, Se, As, Te or Ge.

"Halogen" denotes F, Cl, Br or I, preferably F.

A carbyl or hydrocarbyl group can be a saturated or unsaturated group. Unsaturated groups are, for example, aryl, alkenyl or alkinyl groups. A carbyl or hydrocarbyl group having more than 3 C atoms can be straight chain, branched and/or cyclic and may contain spiro links or condensed rings.

Above and below, the terms "alkyl", "aryl", "heteroaryl", etc., also encompass polyvalent groups, for example alkylene, arylene, heteroarylene, etc. The term "aryl" denotes an aromatic carbon group or a group derived therefrom. The term "heteroaryl" denotes "aryl" in accordance with the above definition containing one or more heteroatoms.

Preferred carbyl and hydrocarbyl groups are optionally substituted alkyl, alkenyl, alkinyl, alkoxy, alkylcarbonyl, alkoxycarbonyl, alkylcarbonyloxy and alkoxycarbonyloxy having 1 to 40, preferably 1 to 25, particularly preferably 1 to 18 C atoms, optionally substituted aryl or aryloxy having 6 to 40, preferably 6 to 25 C atoms, or optionally substituted alkylaryl, arylalkyl, alkylaryloxy, arylalkyloxy, arylcarbonyl, aryloxycarbonyl, arylcarbonyloxy and aryloxycarbonyloxy having 6 to 40, preferably 6 to 25 C atoms. Further preferred carbyl and hydrocarbyl groups are $C_1$-$C_{40}$ alkyl, $C_2$-$C_{40}$ alkenyl, $C_2$-$C_{40}$ alkinyl, $C_3$-$C_{40}$ allyl, $C_4$-$C_{40}$ alkyldienyl, $C_4$-$C_{40}$ polyenyl, $C_6$-$C_{40}$ aryl, $C_6$-$C_{40}$ alkylaryl, $C_6$-$C_{40}$ arylalkyl, $C_6$-$C_{40}$ alkylaryloxy, $C_6$-$C_{40}$ arylalkyloxy, $C_2$-$C_{40}$ heteroaryl, $C_4$-$C_{40}$ cycloalkyl, $C_4$-$C_{40}$ cycloalkenyl, etc. Particular preference is given to $C_1$-$C_{22}$ alkyl, $C_2$-$C_{22}$ alkenyl, $C_2$-$C_{22}$ alkinyl, $C_3$-$C_{22}$ allyl, $C_4$-$C_{22}$ alkyldienyl, $C_6$-$C_{12}$ aryl, $C_6$-$C_{20}$ arylalkyl, and $C_2$-$C_{20}$ heteroaryl.

Further preferred carbyl and hydrocarbyl groups are straight-chain, branched or cyclic alkyl radicals having 1 to 40, preferably 1 to 25 C atoms, more preferably 1 to 12 C atoms, which are unsubstituted or mono- or polysubstituted by F, Cl, Br, I or CN and in which one or more non-adjacent $CH_2$ groups may each be replaced, independently of one another, by —C(R$^x$)=C(R$^x$)—, —C≡C—, —N(R$^x$)—, —O—, —S—, —CO—, —CO—O—, —O—CO—, —O—CO—O— in such a way that O and/or S atoms are not linked directly to one another.

R$^x$ preferably denotes H, halogen, a straight-chain, branched or cyclic alkyl chain having 1 to 25 C atoms, in which, in addition, one or more non-adjacent C atoms may be replaced by —O—, —S—, —CO—, —CO—O—, —O—CO—, —O—CO—O—, and in which one or more H atoms may be replaced by fluorine, an optionally substituted aryl or aryloxy group having 6 to 40 C atoms or an optionally substituted heteroaryl or heteroaryloxy group having 2 to 40 C atoms.

Preferred alkyl groups are, for example, methyl, ethyl, n-propyl, isopropyl, n-butyl, isobutyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, n-nonyl, n-decyl, n-undecyl, n-dodecyl, dodecanyl, trifluoromethyl, perfluoro-n-butyl, 2,2,2-trifluoroethyl, perfluorooctyl, perfluorohexyl, etc.

Preferred alkenyl groups are, for example, ethenyl, propenyl, butenyl, pentenyl, cyclopentenyl, hexenyl, cyclohexenyl, heptenyl, cycloheptenyl, octenyl, cyclooctenyl, etc.

Preferred alkinyl groups are, for example, ethynyl, propynyl, butynyl, pentynyl, hexynyl, octynyl, etc.

Preferred alkoxy groups are, for example, methoxy, ethoxy, 2-methoxy-ethoxy, n-propoxy, i-propoxy, n-butoxy, i-butoxy, s-butoxy, t-butoxy, 2-methylbutoxy, n-pentoxy, n-hexoxy, n-heptyloxy, n-octyloxy, n-nonyloxy, n-decyloxy, n-undecyloxy, n-dodecyloxy, etc.

Preferred amino groups are, for example, dimethylamino, methylamino, methylphenylamino, phenylamino, etc.

Aryl and heteroaryl groups can be monocyclic or polycyclic, i.e. they can have one ring (such as, for example, phenyl) or two or more rings, which may also be fused (such as, for example, naphthyl) or covalently linked (such as, for example, biphenyl), or contain a combination of fused and linked rings. Heteroaryl groups contain one or more heteroatoms, preferably selected from O, N, S, and Se.

Particular preference is given to mono-, bi- or tricyclic aryl groups having 6 to 25 C atoms and mono-, bi- or tricyclic heteroaryl groups having 2 to 25 C atoms, which optionally contain fused rings and are optionally substituted. Preference is furthermore given to 5-, 6-, or 7-membered aryl and heteroaryl groups, in which, in addition, one or more CH groups may be replaced by N, S, or O in such a way that O atoms and/or S atoms are not linked directly to one another.

Preferred aryl groups are, for example, phenyl, biphenyl, terphenyl, [1,1':3',1"]terphenyl-2'-yl, naphthyl, anthracene, binaphthyl, phenanthrene, pyrene, dihydropyrene, chrysene, perylene, tetracene, pentacene, benzopyrene, fluorene, indene, indenofluorene, spirobifluorene, etc.

Preferred heteroaryl groups are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, iso-indole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]

thiophene, dithienothiophene, isobenzothiophene, dibenzothiophene, benzothiadiazothiophene, or combinations of these groups. The heteroaryl groups may also be substituted by alkyl, alkoxy, thioalkyl, fluorine, fluoroalkyl or further aryl or heteroaryl groups.

The (non-aromatic) alicyclic and heterocyclic groups encompass both saturated rings, i.e. those that contain exclusively single bonds, and partially unsaturated rings, i.e. those that may also contain multiple bonds. Heterocyclic rings contain one or more heteroatoms, preferably selected from Si, O, N, S, and Se.

The (non-aromatic) alicyclic and heterocyclic groups can be monocyclic, i.e. contain only one ring (such as, for example, cyclohexane), or polycyclic, i.e. contain a plurality of rings (such as, for example, decahydronaphthalene or bicyclooctane). Particular preference is given to saturated groups. Preference is furthermore given to mono-, bi-, or tricyclic groups having 3 to 25 C atoms, which optionally contain fused rings and which are optionally substituted. Preference is furthermore given to 5-, 6-, 7- or 8-membered carbocyclic groups in which, in addition, one or more C atoms may be replaced by Si and/or one or more CH groups may be replaced by N and/or one or more non-adjacent $CH_2$ groups may be replaced by —O— and/or —S—.

Preferred alicyclic and heterocyclic groups are, for example, 5-membered groups, such as cyclopentane, tetrahydrofuran, tetrahydrothiofuran, pyrrolidine, 6-membered groups, such as cyclohexane, silinane, cyclohexene, tetrahydropyran, tetrahydrothiopyran, 1,3-dioxane, 1,3-dithiane, piperidine, 7-membered groups, such as cycloheptane, and fused groups, such as tetrahydronaphthalene, decahydronaphthalene, indane, bicyclo[1.1.1]-pentane-1,3-diyl, bicyclo[2.2.2]octane-1,4-diyl, spiro[3.3]heptane-2,6-diyl, octahydro-4,7-methanoindane-2,5-diyl.

The aryl, heteroaryl, carbyl, and hydrocarbyl radicals optionally have one or more substituents, which are preferably selected from the group comprising silyl, sulfo, sulfonyl, formyl, amine, imine, nitrile, mercapto, nitro, halogen, $C_{1-12}$ alkyl, $C_{6-12}$ aryl, $C_{1-12}$ alkoxy, hydroxyl, or combinations of these groups.

Preferred substituents are, for example, solubility-promoting groups, such as alkyl or alkoxy, electron-withdrawing groups, such as fluorine, nitro or nitrile, or substituents for increasing the glass transition temperature (Tg) in the polymer, in particular bulky groups, such as, for example, t-butyl or optionally substituted aryl groups.

Preferred substituents, also referred to as "L" below, are, for example, F, Cl, Br, I, OH, —CN, —$NO_2$, —NCO, —NCS, —OCN, —SCN, —C(=O)N($R^x$)$_2$, —C(=O)$Y^1$, —C(=O)$R^x$, —C(=O)O$R^x$, —N($R^x$)$_2$, in which $R^x$ has the above-mentioned meaning, and $Y^1$ denotes halogen, optionally substituted silyl, optionally substituted aryl or heteroaryl having 4 to 40, preferably 4 to 20 ring atoms, and straight-chain or branched alkyl, alkenyl, alkinyl, alkoxy, alkylcarbonyl, alkoxycarbonyl, alkylcarbonyloxy or alkoxycarbonyloxy having 1 to 25 C atoms, in which one or more H atoms may optionally be replaced by F or Cl.

"Substituted silyl or aryl" preferably means substituted by halogen, —CN, $R^0$, —$OR^0$, —CO—$R^0$, —CO—O—$R^0$, —O—CO—$R^0$ or —O—CO—O—$R^0$, in which $R^0$ has the above-mentioned meaning.

Particularly preferred substituents L are, for example, F, Cl, CN, $NO_2$, $CH_3$, $C_2H_5$, $OCH_3$, $OC_2H_5$, $COCH_3$, $COC_2H_5$, $COOCH_3$, $COOC_2H_5$, $CF_3$, $OCF_3$, $OCHF_2$, $OC_2F_5$, furthermore phenyl.

In the formula shown above and below, a substituted phenylene ring

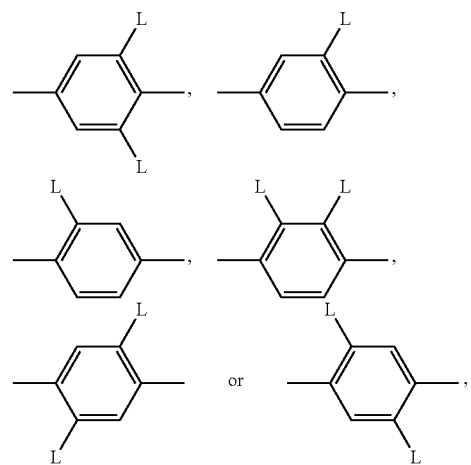

is preferably

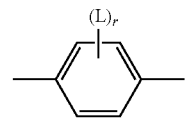

in which L has, on each occurrence identically or differently, one of the meanings given above and below, and is preferably F, Cl, CN, $NO_2$, $CH_3$, $C_2H_5$, $C(CH_3)_3$, $CH(CH_3)_2$, $CH_2CH(CH_3)C_2H_5$, $OCH_3$, $OC_2H_5$, $COCH_3$, $COC_2H_5$, $COOCH_3$, $COOC_2H_5$, $CF_3$, $OCF_3$, $OCHF_2$, $OC_2F_5$ or P-Sp-, very preferably F, Cl, CN, $CH_3$, $C_2H_5$, $OCH_3$, $COCH_3$, $OCF_3$ or P-Sp-, most preferably F, Cl, $CH_3$, $OCH_3$, $COCH_3$ or $OCF_3$.

The polymerizable group P is preferably selected from groups containing a C=C double bond or C≡C triple bond, and groups which are suitable for polymerization with ring opening, such as, for example, oxetane or epoxide groups.

Very preferably the polymerizable group P is selected from the group consisting of $CH_2$=$CW^1$—COO—, $CH_2$=$CW^1$—CO—,

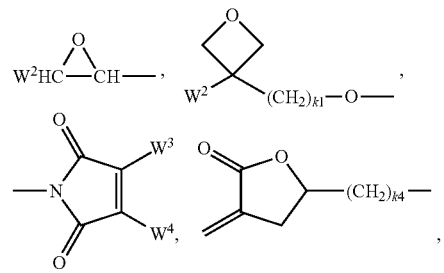

$CH_2$=$CW^2$—(O)$_{k3}$—, $CW^1$=CH—CO—(O)$_{k3}$—, $CW^1$=CH—CO—NH—, $CH_2$=$CW^1$—CO—NH—, $CH_3$—CH=CH—O—, ($CH_2$=CH)$_2$CH—OCO—, ($CH_2$=CH—$CH_2$)$_2$CH—OCO—, ($CH_2$=CH)$_2$CH—O—, ($CH_2$=CH—$CH_2$)$_2$N—, ($CH_2$=CH—$CH_2$)$_2$N—CO—, $CH_2$=$CW^1$—CO—NH—, $CH_2$=CH—(COO)$_{k1}$-Phe-(O)$_{k2}$—, $CH_2$=CH—(CO)$_{k1}$-Phe-(O)$_{k2}$—, Phe-CH=CH—, in which $W^1$ denotes H, F, Cl, CN, $CF_3$, phenyl or alkyl having 1 to 5 C atoms, in particular H, F, Cl or $CH_3$, $W^2$ denotes H or alkyl having 1 to 5 C atoms, in particular H, methyl, ethyl or n-propyl, $W^3$ and $W^4$ each, independently of one another, denote H, Cl or alkyl having 1 to 5 C atoms, Phe denotes 1,4-phenylene, which is optionally substituted by one or more radicals L as being defined above but being different from P-Sp, and $k_1$, $k_2$ and $k_3$ each, independently of one another, denote 0 or 1, $k_3$ preferably denotes 1, and $k_4$ is an integer from 1 to 10.

Particularly preferred groups P are $CH_2$=CH—COO—, $CH_2$=C($CH_3$)—COO—, $CH_2$=CF—COO—, $CH_2$=CH—, $CH_2$=CH—O—, $(CH_2$=CH$)_2$CH—OCO—, $(CH_2$=CH$)_2$CH—O—,

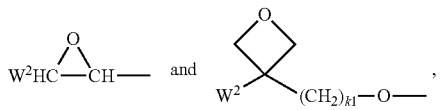

in particular vinyloxy, acrylate, methacrylate, fluoroacrylate, chloroacrylate, oxetane and epoxide, most preferably acrylate or methacrylate.

In a further preferred embodiment of the invention, all polymerizable compounds and sub-formulae thereof contain instead of one or more radicals P-Sp-, one or more branched radicals containing two or more polymerizable groups P (multireactive polymerizable radicals). Suitable radicals of this type, and polymerizable compounds containing them, are described, for example, in U.S. Pat. No. 7,060,200 B1 or US 2006/0172090 A1. Particular preference is given to multireactive polymerizable radicals selected from the following formulae:

—X-alkyl-CHP$^1$—CH$_2$—CH$_2$P$^2$  I*a

—X-alkyl-C(CH$_2$P$^1$)(CH$_2$P$^2$)—CH$_2$P$^3$  I*b

—X-alkyl-CHP$^1$CHP$^2$—CH$_2$P$^3$  I*c

—X-alkyl-C(CH$_2$P$^1$)(CH$_2$P$^2$)—C$_{aa}$H$_{2aa+1}$  I*d

—X-alkyl-CHP$^1$—CH$_2$P$^2$  I*e

—X-alkyl-CHP$^1$P$^2$  I*f

—X-alkyl-CP$^1$P$^2$—C$_{aa}$H$_{2aa+1}$  I*g

—X-alkyl-C(CH$_2$P$^1$)(CH$_2$P$^2$)—CH$_2$OCH$_2$—C(CH$_2$P$^3$)(CH$_2$P$^4$)CH$_2$P$^5$  I*h —X-alkyl-CH((CH$_2$)$_{aa}$P$^1$)((CH$_2$)$_{bb}$P$^1$)  I*i —X-alkyl-CHP$^1$CHP$^2$—C$_{aa}$H$_{2aa+1}$  I*k in which
alkyl denotes a single bond or straight-chain or branched alkylene having 1 to 12 C atoms, in which one or more non-adjacent CH$_2$ groups may each be replaced, independently of one another, by —C(R$^x$)=C(R$^x$)—, —C≡C—, —N(R$^x$)—, —O—, —S—, —CO—, —CO—O—, —O—CO—, —O—CO—O— in such a way that O and/or S atoms are not linked directly to one another, and in which, in addition, one or more H atoms may be replaced by F, Cl or CN, where R$^x$ has the above-mentioned meaning and preferably denotes R$^0$ as defined above, aa and bb each, independently of one another, denote 0, 1, 2, 3, 4, 5 or 6, X has one of the meanings indicated for X', and P$^{1-5}$ each, independently of one another, have one of the meanings indicated above for P.

Preferred spacer groups Sp are selected from the formula Sp'-X', so that the radical "P-Sp-" conforms to the formula "P-Sp'-X'—", where Sp' denotes alkylene having 1 to 20, preferably 1 to 12 C atoms, which is optionally mono- or polysubstituted by F, Cl, Br, I or CN and in which, in addition, one or more non-adjacent CH$_2$ groups may each be replaced, independently of one another, by —O—, —S—, —NH—, —NR$^{01}$—, —SiR$^{01}$R$^{02}$—, —CO—, —COO—, —OCO—, —OCO—O—, —S—CO—, —CO—S—, —NR$^{01}$—CO—O—, —O—CO—NR$^{01}$—, —NR$^{01}$—CO—NR$^{01}$—, —CH=CH— or —C≡C— in such a way that O and/or S atoms are not linked directly to one another, X' denotes —O—, —S—, —CO—, —COO—, —OCO—, —O—COO—, —CO—NR$^{01}$—, —NR$^{01}$—CO—, —NR$^{01}$—CO—NR$^{01}$—, —OCH$_2$—, —CH$_2$O—, —SCH$_2$—, —CH$_2$S—, —CF$_2$O—, —OCF$_2$—, —CF$_2$S—, —SCF$_2$—, —CF$_2$CH$_2$—, —CH$_2$CF$_2$—, —CF$_2$CF$_2$—, —CH=N—, —N=CH—, —N=N—, —CH=CR$^{01}$—, —CY$^{01}$=CY$^{02}$—, —C≡C—, —CH=CH—COO—, —OCO—CH=CH— or a single bond, R$^{01}$ and R$^{02}$ each, independently of one another, denote H or alkyl having 1 to 12 C atoms, and Y$^{01}$ and Y$^{02}$ each, independently of one another, denote H, F, Cl or CN.

X' is preferably —O—, —S—, —CO—, —COO—, —OCO—, —O—COO—, —CO—NR$^0$—, —NR$^{01}$—CO—, —NR$^{01}$—CO—NR$^{01}$— or a single bond.

Typical spacer groups Sp' are, for example, —(CH$_2$)$_{p1}$—, —(CH$_2$CH$_2$O)$_{q1}$—CH$_2$CH$_2$—, —CH$_2$CH$_2$—S—CH$_2$CH$_2$—, —CH$_2$CH$_2$—NH—CH$_2$CH$_2$— or —(SiR$^{01}$R$^{02}$—O)$_{p1}$—, in which p1 is an integer from 1 to 12, q1 is an integer from 1 to 3, and R$^{01}$ and R$^{02}$ have the above-mentioned meanings.

Particularly preferred groups —X'-Sp'- are —(CH$_2$)$_{p1}$—, —O—(CH$_2$)$_{p1}$—, —OCO—(CH$_2$)$_{p1}$—, —OCOO—(CH$_2$)$_{p1}$—.

Particularly preferred groups Sp' are, for example, in each case straight-chain ethylene, propylene, butylene, pentylene, hexylene, heptylene, octylene, nonylene, decylene, undecylene, dodecylene, octadecylene, ethyleneoxyethylene, methyleneoxybutylene, ethylenethioethylene, ethyl-ene-N-methyliminoethylene, 1-methylalkylene, ethenylene, propenylene and butenylene.

Dichroic photoinitiators, which preferably can be used for the method according to the present invention, are the following

I-1

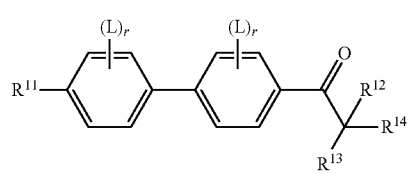

-continued

I-2
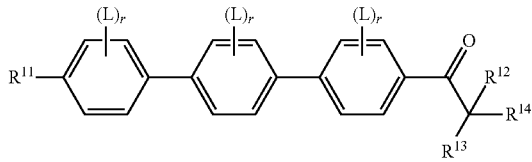

I-3
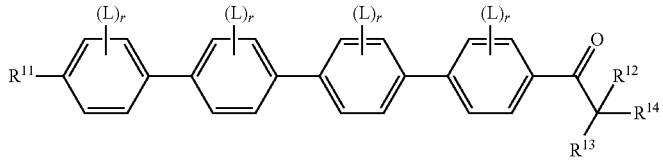

I-4
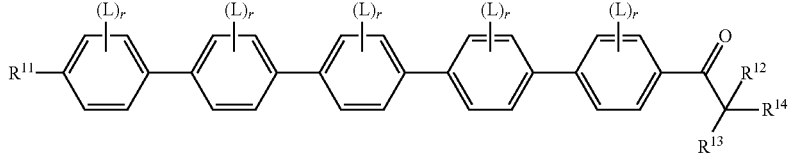

I-5
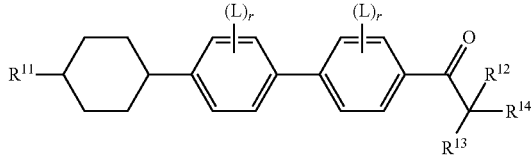

I-6
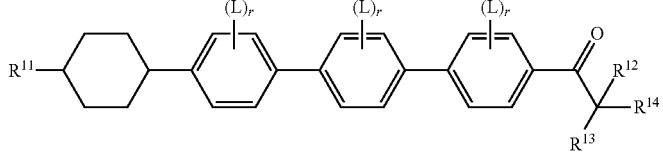

I-7
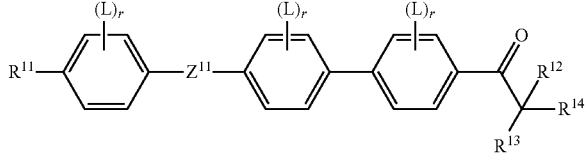

I-8
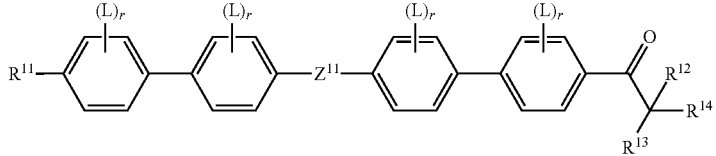

wherein
L denotes each and independently from another in each occurrence, halogen, preferably F or Br,
r denotes each and independently from another in each occurrence 0, 1 or 2,
$Z^{11}$ denotes, —O—, —S—, —CO—, —COO—, —OCO—, —S—CO—, —CO—S—, —O—COO—, —CO—$NR^{01}$—, —$NR^{01}$—CO—, —$NR^{01}$—CO—$NR^{02}$, —$NR^{01}$—CO—O—, —O—CO—$NR^{01}$—, —OCH$_2$—, —CH$_2$O—, —SCH$_2$—, —CH$_2$S—, —CF$_2$O—, —OCF$_2$—, —CF$_2$S—, —SCF$_2$—, —CH$_2$CH$_2$—, —(CH$_2$)$_4$—, —CF$_2$CH$_2$—, —CH$_2$CF$_2$—, —CF$_2$CF$_2$—, —CH=N—, —N=CH—, —N=N—, —CH=$CR^{01}$—, —$CY^{01}$=$CY^2$—, —C≡C—, —CH=CH—COO—, —OCO—CH=CH—,
$R^{11}$ denotes a straight chain or branched alkyl with 1 to 12 C-atoms that is optionally mono- or polysubstituted by F, and wherein one or more non-adjacent CH$_2$ groups are optionally replaced, in each case independently from one another, by —O—, —S—, in such a manner that O and/or S atoms are not linked directly to one another; P-Sp-; or $R^{14}$,
$R^{12-13}$ are independently of each other H, or straight chain alkyl with 1 to 5 C-atoms,
$R^{14}$ denotes —OH, —$NR^{01}R^{02}$ or

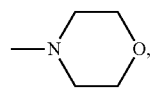

$Y^{01}$ and $Y^{02}$ each, independently of one another, denote H, F, Cl or CN, and $R^{O1}$ and $R^{O2}$ are independently of each other H, or straight chain or branched alkyl with 1 to 5 C-atoms.
Especially preferred dichroic photoinitiators are selected from the following formulae
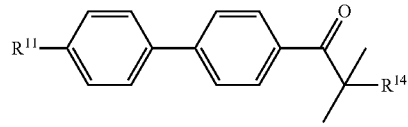
I-1a
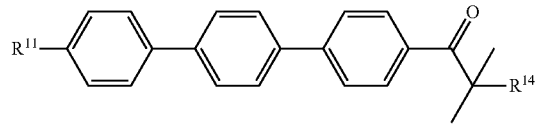
I-2a
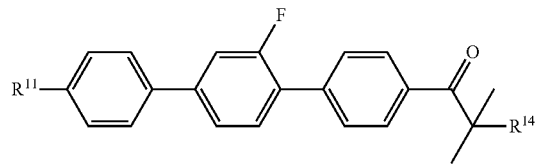
I-2b
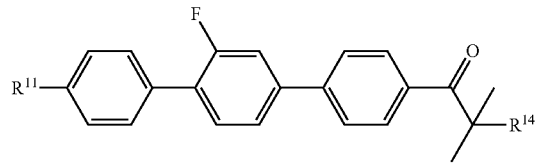
I-2c
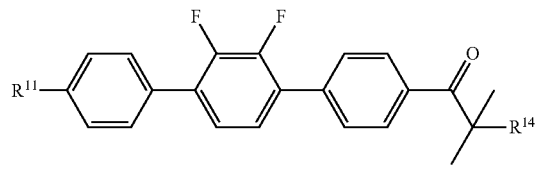
I-2d
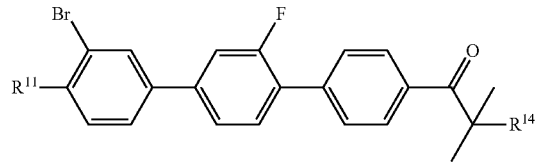
I-2e
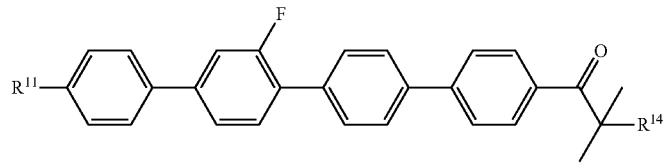
I-3a
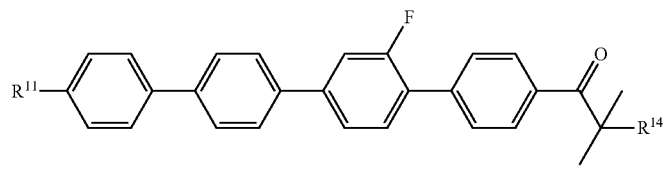
I-3b
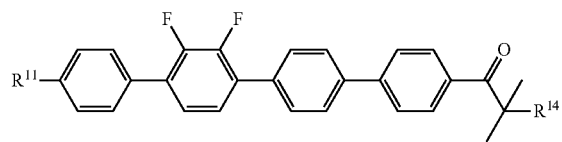
I-3c -continued I-3d
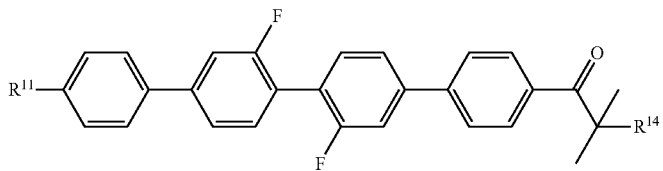

I-4a
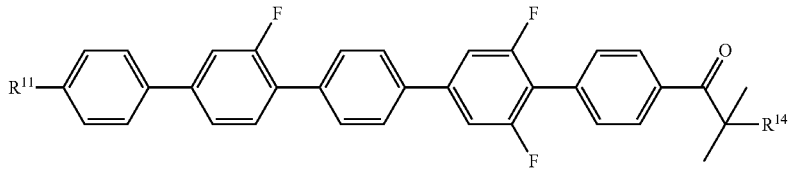

I-4b
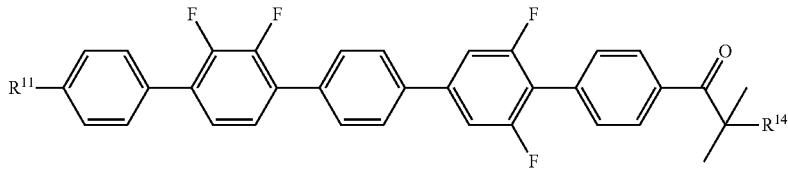

I-5a
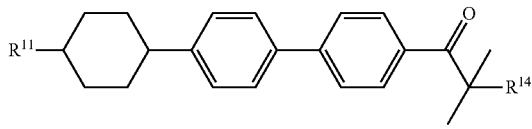

I-6a
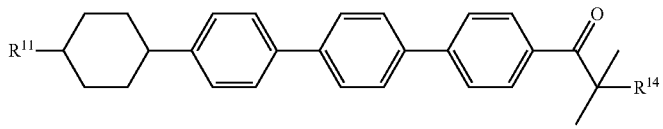

I-7a
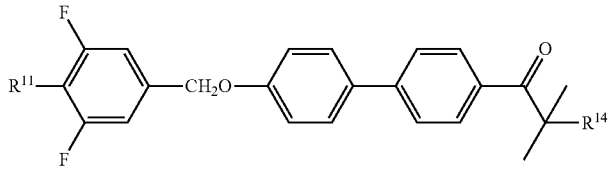

I-7b
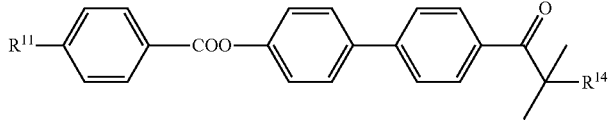

I-8a
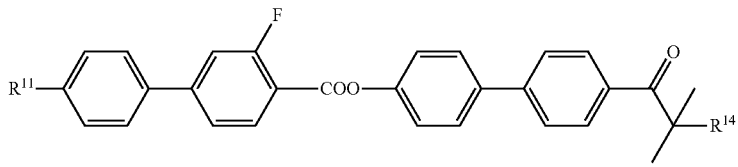

wherein
$R^{14}$ denotes —OH, —NH$_2$ or

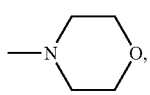

and
$R^{11}$ denotes a straight chain or branched alkyl with 1 to 12 C-atoms that is optionally mono- or polysubstituted by F, and wherein one or more non-adjacent CH$_2$ groups are optionally replaced, in each case independently from one another, by —O—, —S—, in such a manner that O and/or S atoms are not linked directly to one another; P-Sp-; or $R^{14}$.

In particular preferred dichroic photoinitiators are compounds of formula I-2a and I-5a, wherein $R^{14}$ denotes —OH, compounds of formula I-2a, wherein $R^{14}$ denotes —NH$_2$, and compounds of formula I-2a to I-2e, I-3a to I-3d, I-4a to I-4b, I-6a, I-7a, I-7b, and I-8a wherein $R^{14}$ denotes

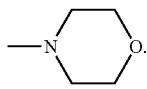

The proportion of the dichroic photoinitiator in a preferred liquid-crystalline material used for the method according to the present invention as a whole is preferably in the range from about 1 to about 25% by weight, more preferably in the range from about 3 to about 20% by weight and even more preferably in the range from about 5 to about 15% by weight.

Suitable chiral compounds according to the instant invention can be polymerizable or non-polymerizable.

Preferably used polymerizable chiral compounds according to the instant invention preferably have each alone or in combination with each other an absolute value of the helical twisting power ($|HTP_{total}|$) of 25 $\mu m^{-1}$ or more, preferably of 40 $\mu m^{-1}$ or more, more preferably in the range of 60 $\mu m^{-1}$ or more, most preferably in the range of 80 $\mu m^{-1}$ or more to 260 $\mu m^{-1}$ or less.

Preferred polymerizable chiral compounds can be mono-, di-, or multireactive chiral polymerizable mesogenic compounds. Preferably, such compounds comprise one or more ring elements, linked together by a direct bond or via a linking group, and where two of these ring elements optionally may be linked to each other, either directly or via a linking group, which may be identical to or different from the linking group mentioned. The ring elements are preferably selected from the group of four-, five-, six-, or seven-, preferably of five- or six-, membered rings.

Suitable polymerizable chiral compounds and their synthesis are described e.g. in U.S. Pat. No. 7,223,450 B2, or commercially available like Paliocolor LC756® (BASF AG).

Preferred mono-, di-, or multireactive chiral polymerizable mesogenic compounds used according to the present invention the polymerizable are selected from the following formulae

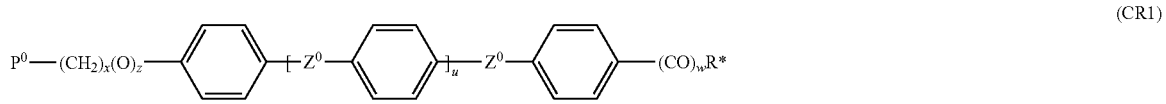
(CR1)

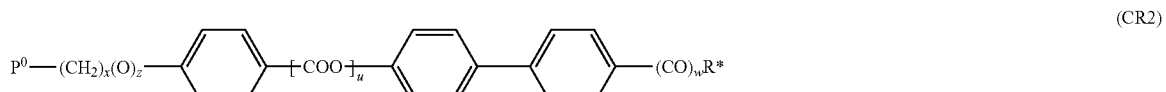
(CR2)

(CR3)

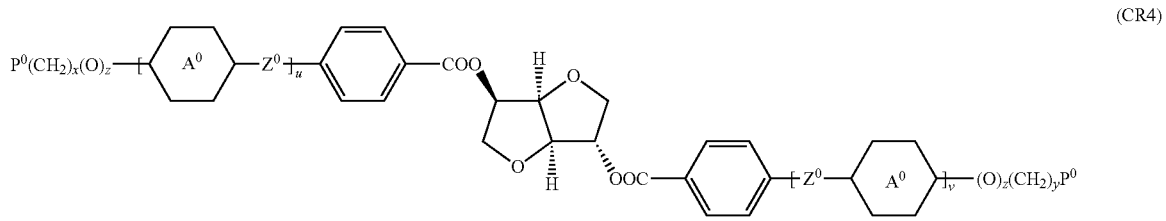
(CR4)

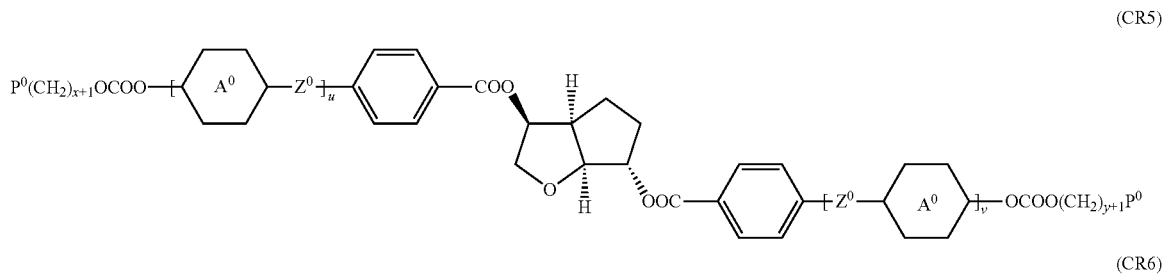
(CR5)

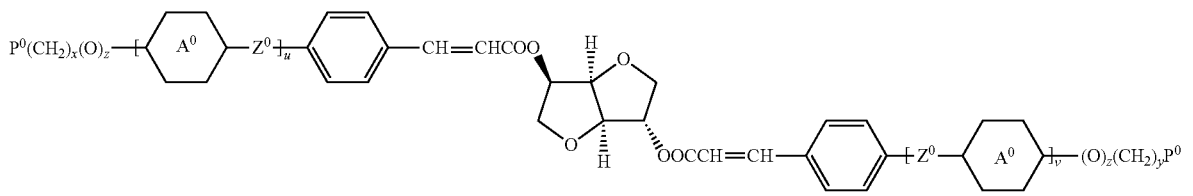
(CR6)

-continued

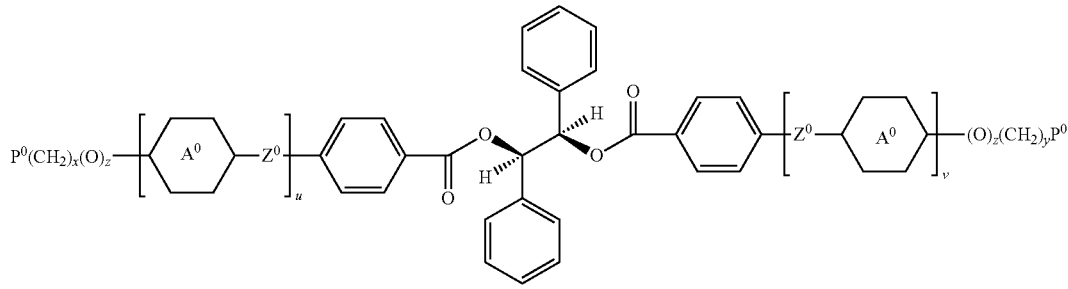

(CR7)

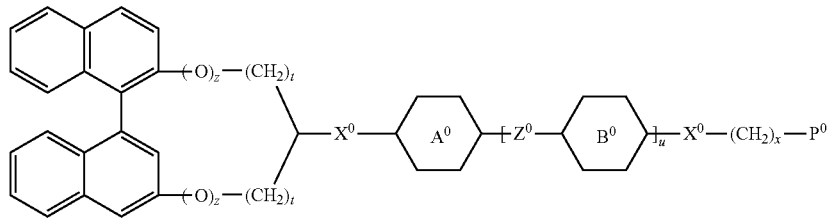

(CR8)

wherein
P⁰ is, in case of multiple occurrence independently of one another, a polymerizable group, preferably an acryl, methacryl, oxetane, epoxy, vinyl, vinyloxy, propenyl ether or styrene group,
A⁰ and B⁰ are, in case of multiple occurrence independently of one another, 1,4-phenylene that is optionally substituted with 1, 2, 3 or 4 groups L, or trans-1,4-cyclohexylene,
X⁰ and Z⁰ is, in case of multiple occurrence independently of one another, —COO—, —OCO—, —CH₂CH₂—, —C≡C—, —CH=CH—, —CH=CH—COO—, —OCO—CH=CH— or a single bond,
R* is a chiral alkyl or alkoxy group with 4 or more, preferably 4 to 12 C atoms, like 2-methylbutyl, 2-methyloctyl, 2-methylbutoxy or 2-methyloctoxy,
Ch is a chiral group selected from cholesteryl, estradiol, or terpenoid radicals like menthyl or citronellyl,
L has one of the meaning as defined above in formula I,
r is 0, 1, 2, 3 or 4, preferably 0, 1 or 2,
t is, in case of multiple occurrence independently of one another, 0, 1, 2 or 3,
u and v are independently of each other 0, 1 or 2,
w is 0 or 1,
x are independently of each other 0 or identical or different integers from 1 to 12,
z is 0 or 1, with z being 0 if the adjacent x or y is 0,
and wherein the benzene and naphthalene rings can additionally be substituted with one or more identical or different groups L.

In a preferred embodiment, the proportion of the monoreactive polymerizable mesogenic compounds, preferably selected from formulae II-1, II-13 in a liquid-crystalline material used for the method according to the present invention as a whole, is preferably in the range from 2 to 20% by weight, more preferably in the range from 4 to 12% by weight and even more preferably in the range from 5 to 10% by weight.

In another preferred embodiment, the proportion of the direactive polymerizable mesogenic compounds, preferably selected from formula II-27 in a liquid-crystalline material used for the method according to the present invention as a whole, is preferably in the range from 0 to 30% by weight, more preferably in the range from 0 to 20% by weight and even more preferably in the range from 0 to 10% by weight.

In another preferred embodiment, the proportion of the multireactive polymerizable mesogenic compounds in a liquid-crystalline material used for the method according to the present invention as a whole, is preferably in the range from 0 to 30% by weight, more preferably in the range from 0 to 20% by weight and even more preferably in the range from 0 to 10% by weight.

The proportion of said chiral polymerizable mesogenic compounds, preferably selected from formula CR8 in a preferred liquid-crystalline material used for the method according to the present invention as a whole, is preferably in the range from 1 to 30% by weight, more preferably in the range from 1 to 20% by weight and even more preferably in the range from 1 to 10% by weight.

In another preferred embodiment, the polymerizable liquid crystalline material comprises one or more non-polymerizable chiral compounds, in particular those disclosed in WO 98/00428. Further, typically used non-polymerizable chiral compounds are e.g. the commercially available R/S-5011, R-811, or CB-15 (from Merck KGaA, Darmstadt, Germany).

The proportion of said chiral non-polymerizable mesogenic compounds in a preferred liquid-crystalline material used for the method according to the present invention as a whole is preferably in the range from 1 to 20% by weight, more preferably in the range from 3 to 15% by weight and even more preferably in the range from 5 to 10% by weight.

Preferably, the polymerizable liquid-crystalline material used for the method according to the present invention is a mixture of two or more, for example 2 to 25 liquid-crystalline compounds.

The method according to the present invention is not limited to specific liquid-crystalline materials, but can in principle be used for alignment of all RMs known from prior art. The RMs are preferably selected from calamitic or discotic compounds demonstrating thermotropic or lyotropic liquid crystallinity, very preferably calamitic compounds, or mixtures of one or more types of these compounds having liquid-crystalline mesophases in a certain temperature range. These materials typically have good optical properties, like reduced chromaticity, and can be easily and quickly aligned into the desired orientation, which is especially important for the industrial production of polymer films at large scale. The liquid crystals can be small molecules (i.e. monomeric compounds) or liquid-crystalline oligomers.

In another preferred embodiment, a suitable polymerizable liquid-crystalline material in accordance with the present invention comprises one or more polymerizable mono-, di- or multireactive liquid crystalline compounds, which are preferably selected from the compound of formula II, $$P\text{-}Sp\text{-}MG\text{-}R^0 \qquad \qquad II$$

wherein
P is a polymerizable group, preferably an acryl, methacryl, vinyl, vinyloxy, propenyl ether, epoxy, oxetane or styrene group,
Sp is a spacer group or a single bond,
MG is a rod-shaped mesogenic group, which is preferably selected of formula M,
M is $-(A^{21}\text{-}Z^{21})_k A^{22}\text{-}(Z^{22}\text{-}A^{23})_l\text{-}$,
$A^{21}$ to $A^{23}$ are in each occurrence independently of one another an aryl-, heteroaryl-, heterocyclic- or alicyclic group optionally being substituted by one or more identical or different groups L, preferably 1,4-cyclohexylene or 1,4-phenylene, 1,4 pyridine, 1,4-pyrimidine, 2,5-thiophene, 2,6-dithieno[3,2-b:2',3'-d]thiophene, 2,7-fluorine, 2,6-naphtalene, 2,7-phenanthrene optionally being substituted by one or more identical or different groups L,
$Z^{21}$ and $Z^{22}$ are in each occurrence independently from each other, —O—, —S—, —CO—, —COO—, —OCO—, —S—CO—, —CO—S—, —O—COO—, —CO—NR$^{01}$—, —NR$^{01}$—CO—, —NR$^{01}$—CO—NR$^{02}$, —NR$^{01}$—CO—O—, —O—CO—NR$^{01}$—, —OCH$_2$—, —CH$_2$O—, —SCH$_2$—, —CH$_2$S—, —CF$_2$O—, —OCF$_2$—, —CF$_2$S—, —SCF$_2$—, —CH$_2$CH$_2$—, —(CH$_2$)$_4$—, —CF$_2$CH$_2$—, —CH$_2$CF$_2$—, —CF$_2$CF$_2$—, —CH=N—, —N=CH—, —N=N—, —CH=CR$^{01}$—, —CY$^{01}$=CY$^{02}$—, —C≡C—, —CH=CH—COO—, —OCO—CH=CH—, or a single bond, preferably —COO—, —OCO—, —CO—O—, —O—CO—, —OCH$_2$—, —CH$_2$O—, -, —CH$_2$CH$_2$—, —(CH$_2$)$_4$—, —CF$_2$CH$_2$—, —CH$_2$CF$_2$—, —CF$_2$CF$_2$—, —C≡C—, —CH=CH—COO—, —OCO—CH=CH—, or a single bond,
L has one of the meanings as defined above in formula I,
$R^0$ is H, alkyl, alkoxy, thioalkyl, alkylcarbonyl, alkoxycarbonyl, alkylcarbonyloxy or alkoxycarbonyloxy with 1 to 20 C atoms more, preferably 1 to 15 C atoms which are optionally fluorinated, or is $Y^0$ or P-Sp-,
$Y^0$ is F, Cl, CN, NO$_2$, OCH$_3$, OCN, SCN, optionally fluorinated alkylcarbonyl, alkoxycarbonyl, alkylcarbonyloxy or alkoxycarbonyloxy with 1 to 4 C atoms, or mono- oligo- or polyfluorinated alkyl or alkoxy with 1 to 4 C atoms, preferably F, Cl, CN, NO$_2$, OCH$_3$, or mono- oligo- or polyfluorinated alkyl or alkoxy with 1 to 4 C atoms
$Y^{01}$ and $Y^{02}$ have each and independently the meaning as defined above in formula I,
$R^{01}$ and $R^{02}$ have each and independently the meaning as defined above in formula I, and
k and l are each and independently 0, 1, 2, 3 or 4, preferably 0, 1 or 2, most preferably 1.

Preferred polymerizable polymerizable mono-, di-, or multireactive liquid crystalline compounds are disclosed for example in WO 93/22397, EP 0 261 712, DE 195 04 224, WO 95/22586, WO 97/00600, U.S. Pat. Nos. 5,518,652, 5,750,051, 5,770,107 and 6,514,578.

Further preferred polymerizable mono-, di-, or multireactive liquid crystalline compounds are shown in the following list:

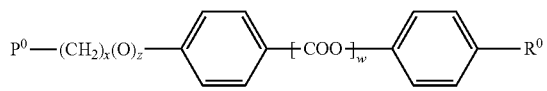

II-1

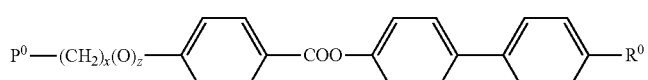

II-2

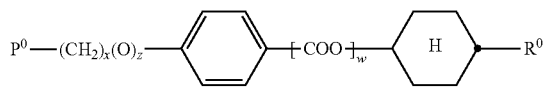

II-3

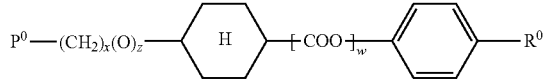

II-4

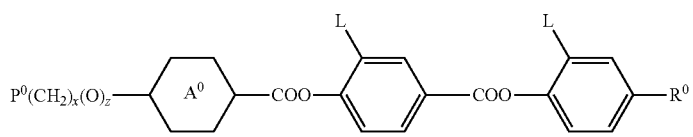

II-5

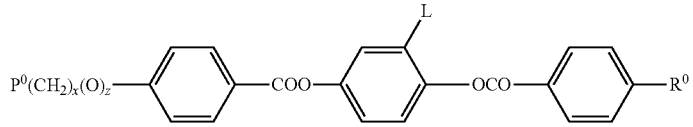

II-6

-continued
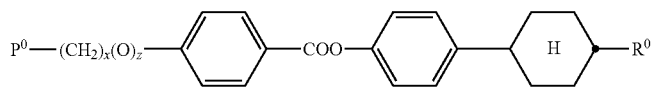
II-7
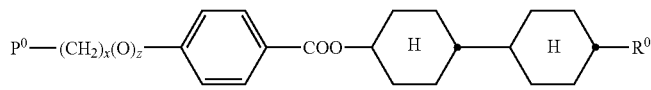
II-8
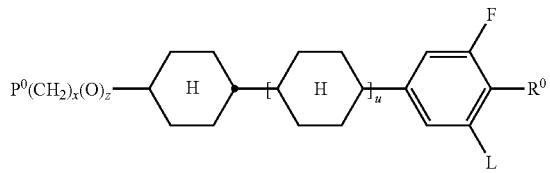
II-9
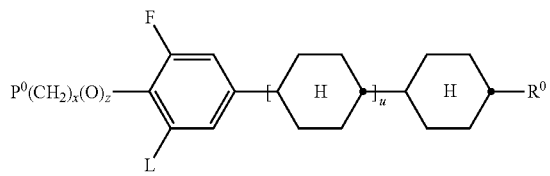
II-10
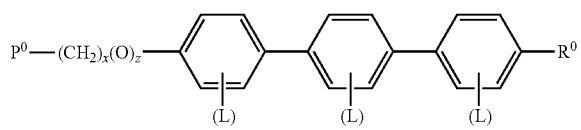
II-11
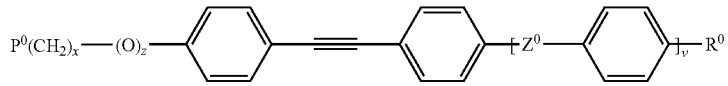
II-12
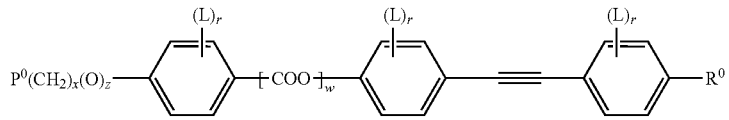
II-13
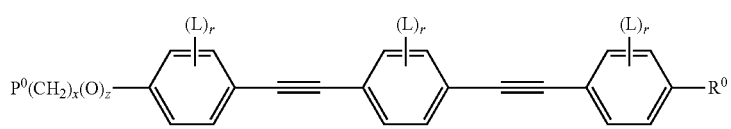
II-14
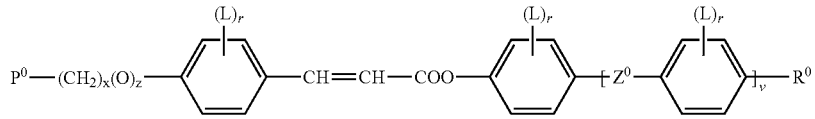
II-15
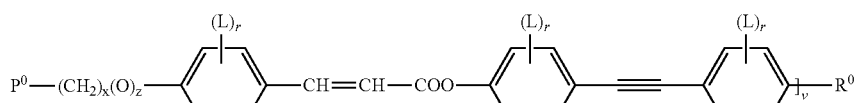
II-16
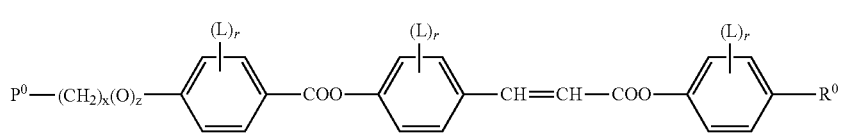
II-17
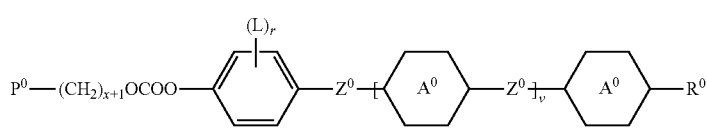
II-18

-continued
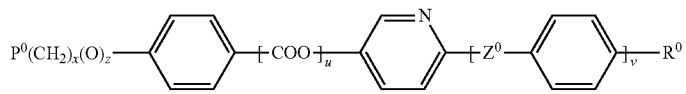
II-19
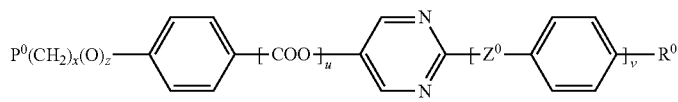
II-20
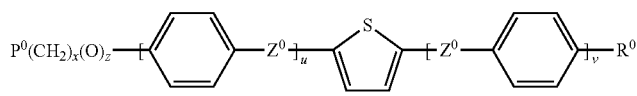
II-21
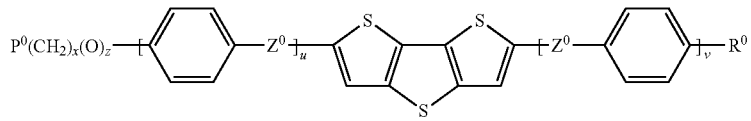
II-22
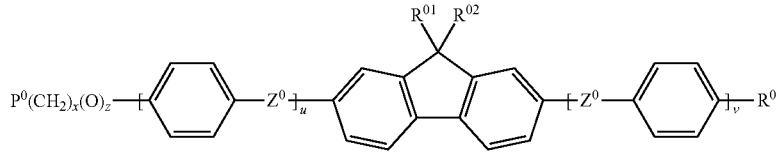
II-23
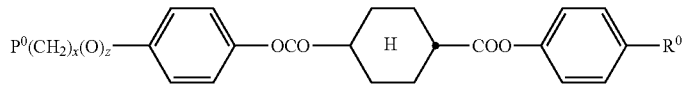
II-24
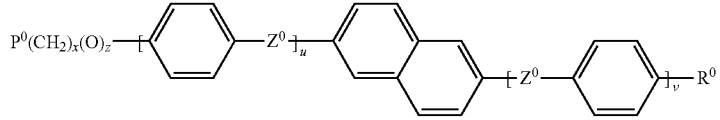
II-25
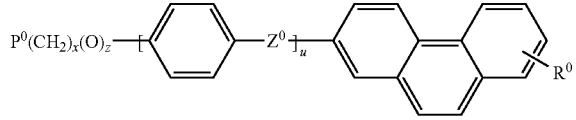
II-26
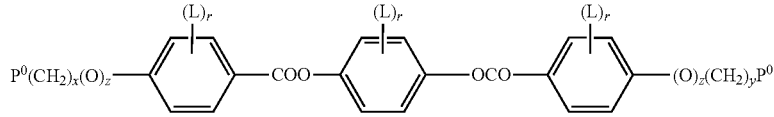
II-27
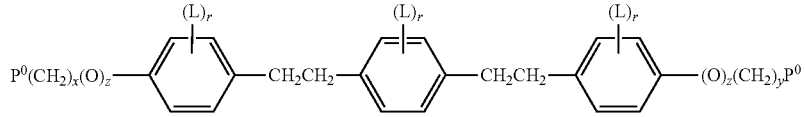
II-28
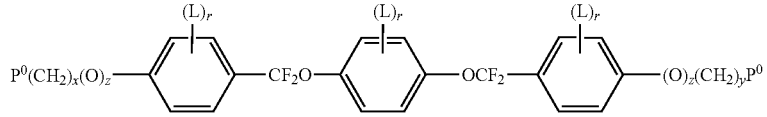
II-29
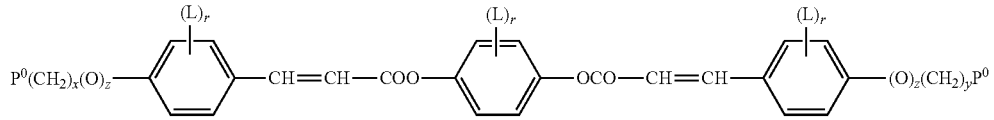
II-30

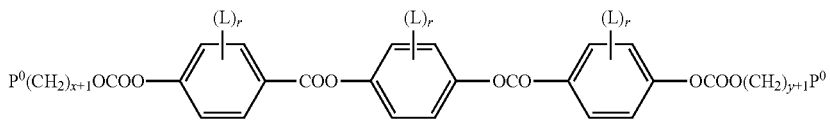

II-31

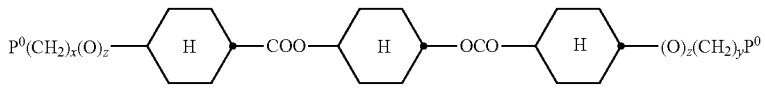

II-32

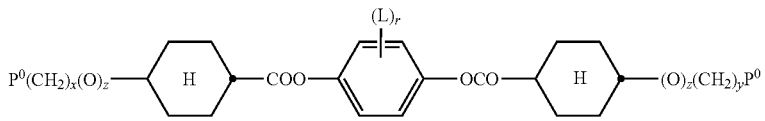

II-33

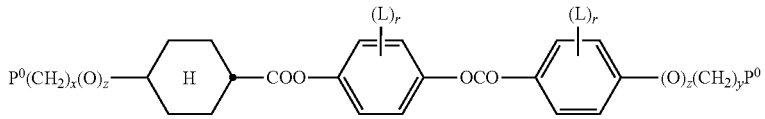

II-34 wherein $P^0$ is, in case of multiple occurrence independently of one another, a polymerizable group, preferably an acryl, methacryl, oxetane, epoxy, vinyl, vinyloxy, propenyl ether or styrene group, $A^0$ is, in case of multiple occurrence independently of one another, 1,4-phenylene that is optionally substituted with 1, 2, 3 or 4 groups L, or trans-1,4-cyclohexylene, $Z^0$ is, in case of multiple occurrence independently of one another, —COO—, —OCO—, —CH$_2$CH$_2$—, —C≡C—, —CH=CH—, —CH=CH—COO—, —OCO—CH=CH— or a single bond, r is 0, 1, 2, 3 or 4, preferably 0, 1 or 2, t is, in case of multiple occurrence independently of one another, 0, 1, 2 or 3, u and v are independently of each other 0, 1 or 2, w is 0 or 1, x and y are independently of each other 0 or identical or different integers from 1 to 12, z is 0 or 1, with z being 0 if the adjacent x or y is 0, in addition, wherein the benzene and naphthalene rings can additionally be substituted with one or more identical or different groups L. The parameter $R^0$, $Y^0$, $R^{01}$, $R^2$ and L have the same meanings as given above in formula II.

The proportion of said mono-, di- or multireactive liquid crystalline compounds in a preferred liquid-crystalline material used for the method according to the present invention as a whole, is preferably in the range from 30 to 99% by weight, more preferably in the range from 40 to 95% by weight and even more preferably in the range from 50 to 90% by weight.

The polymerizable liquid-crystalline material used in accordance with the present invention may also comprise one or more surfactants, which are commonly known to the expert. Preferably in an amount of 0 to 3% by weight, more preferably 0 to 1.5% by weight, even more preferably 0.1 to 0.7% by weight, in particular selected from the commercially available surfactants TegoRad 2500 (Evonik), or FluorN 561 or 562 (Cytonix).

Suitable polymerizable liquid-crystalline materials used for the method according to the present invention, may also comprise one or more dyes having an absorption maximum adjusted to the wavelength of the radiation used for polymerization, in particular UV dyes like e.g. 4,4"-azoxy anisole or Tinuvin® dyes (from Ciba AG).

The polymerizable liquid-crystalline material used in accordance with the present invention may also comprises one or more stabilizers or inhibitors to prevent undesired spontaneous polymerization, preferably in an amount of 0 to 0.1%, very preferably 0 to 0.2%, for example selected from the commercially available Irganox® series (Ciba AG), like Irganox 1076.

In a preferred embodiment, the suitable polymerizable liquid-crystalline material used for the method according to the present invention comprises one or more monoreactive polymerizable non-mesogenic compounds, preferably in an amount of 0 to 50%, very preferably 0 to 20%. Typical examples are alkylacrylates or alkylmethacrylates, preferably isobornyl methacrylate.

In another preferred embodiment the polymerizable liquid-crystalline material used for the method according to the present invention, optionally comprises one or more di-, or multireactive polymerizable non-mesogenic compounds, preferably in an amount of 0 to 50%, very preferably 0 to 20%, alternatively or in addition to the di-, or multireactive polymerizable mesogenic compounds. Typical examples of direactive monomers are alkyldiacrylates or alkyldimethacrylates with alkyl groups of 1 to 20 C atoms or hexanediol diacrylate. Typical examples of multireactive monomers are trimethylpropanetrimethacrylate, or pentaerythritoltetraacrylate.

It is also possible to add one or more chain transfer agents to the polymerizable liquid-crystalline material in order to modify the physical properties of the polymer film. Especially preferred are thiol compounds, for example monoreactive thiols like dodecane thiol or multireactive thiols like trimethylpropane tri(3-mercaptopropionate). Very preferred are mesogenic or liquid-crystalline thiols as disclosed for example in WO 96/12209, WO 96/25470, or U.S. Pat. No. 6,420,001. By using chain transfer agents the length of the free polymer chains and/or the length of the polymer chains between two crosslinks in the polymer film can be controlled. When the amount of the chain transfer agent is increased, the polymer chain length in the polymer film decreases.

The polymerizable liquid-crystalline material in accordance with the present invention may also comprise a polymeric binder or one or more monomers capable of forming a polymeric binder, and/or one or more dispersion auxiliaries. Suitable binders and dispersion auxiliaries are disclosed for example in WO 96/02597. Preferably, however, the polymerizable material does not contain a binder or dispersion auxiliary.

Said polymerizable liquid-crystalline material can additionally comprise one or more additional components like for example catalysts, sensitizers, stabilizers, inhibitors, chain-transfer agents, co-reacting monomers, lubricating agents, wetting agents, dispersing agents, hydrophobing agents, adhesive agents, flow improvers, defoaming agents, deaerators, diluents, reactive diluents, auxiliaries, colourants, dyes or pigments.

Preferably, the polymerizable liquid-crystalline material comprises,
- a) one or more achiral mono-, di- or multireactive polymerizable mesogenic compounds,
- b) one or more dichroic photoinitiator,
- c) one or more (polymerizable) chiral compounds,
- d) optionally one or more surfactants,
- e) optionally one or more stabilizers,
- f) optionally one or more mono-, di- or multireactive polymerizable non-mesogenic compounds,
- g) optionally one or more non-polymerizable chiral compounds
- h) optionally one or more dyes showing an absorption maximum at the wavelength used to initiate photo polymerization,
- i) optionally one or more chain transfer agents,
- j) optionally one or more stabilizers.

More preferably, the polymerizable liquid crystalline material comprises,
- a) one or more achiral monoreactive polymerizable mesogenic compounds, preferably in an amount of 30 to 95% by weight, very preferably 50 to 90%, preferably selected from the compounds of formulae II-1 and/or II-13;
- b) one or more achiral di- or multireactive polymerizable mesogenic compounds, preferably in an amount of 0.1 to 30% by weight, very preferably 0.5 to 20% by weight preferably selected from the compounds of formula 11-6;
- c) one or more dichroic photoinitiator, preferably in an amount of 3 to 20% by weight, very preferably 5 to 15% by weight, preferably selected from the compounds of formulae I-2a, I-3a and/or I-5a, more preferably selected from the compounds of formulae I-2a or I-3a;
- d) one or more polymerizable chiral compounds, preferably one or more monoreactive chiral compounds, preferably in an amount of 2 to 20% by weight, very preferably 5 to 10% by weight, preferably selected from the compounds of formulae CR8;
- e) optionally one or more surfactants; and
- f) optionally one or more stabilizers.

The polymerizable liquid-crystalline material used in accordance with the present invention is prepared in a manner conventional per se, for example by mixing one or more of the above-mentioned dichroic photoinitiator with one or more chiral compounds, and one or more polymerizable liquid crystalline compounds of formula II as defined above, and optionally with further liquid-crystalline compounds and/or additives. In general, the desired amount of the components used in lesser amount is dissolved in the components making up the principal constituent, advantageously at elevated temperature. It is also possible to mix solutions of the components in an organic solvent, for example in acetone, chloroform, or methanol, and to remove the solvent again, for example by distillation, after thorough mixing.

The polymerizable liquid-crystalline material can be applied onto a substrate by conventional coating techniques like spin coating or blade coating. It can also be applied to the substrate by conventional printing techniques which are known to the expert, like for example screen printing, offset printing, reel-to-reel printing, letter press printing, gravure printing, rotogravure printing, flexographic printing, intaglio printing, pad printing, heat-seal printing, ink-jet printing or printing by means of a stamp or printing plate.

It is also possible to dissolve the polymerizable liquid-crystalline material in a suitable solvent. This solution is then coated or printed onto the substrate, for example by spin-coating, printing, or other known techniques, and the solvent is evaporated off before polymerization. In most cases, it is suitable to heat the mixture in order to facilitate the evaporation of the solvent. As solvents, for example standard organic solvents can be used. The solvents can be selected for example from ethers such as THF, ketones such as acetone, methyl ethyl ketone, methyl propyl ketone or cyclohexanone; acetates such as methyl, ethyl or butyl acetate or methyl acetoacetate; alcohols such as methanol, ethanol or isopropyl alcohol; aromatic solvents such as toluene or xylene; halogenated hydrocarbons such as di- or trichloromethane; glycols or their esters such as PGMEA (propyl glycol monomethyl ether acetate), γ-butyrolactone, and the like. It is also possible to use binary, ternary, or higher mixtures of the above solvents.

As a substrate for the method according to the present invention, for example a glass or quartz plate or a plastic film or plate can be used. Suitable and preferred plastic substrates are for example films of polyester such as polyethyleneterephthalate (PET) or polyethylene-naphthalate (PEN), polyvinylalcohol (PVA), polycarbonate (PC) or triacetylcellulose (TAC), very preferably PET or TAC films. As birefringent substrates for example uniaxially stretched plastics, film can be used. PET films are commercially available for example from DuPont Teijin Films under the trade name Melinex®. In particular preferred substrates are TAC, PET, PVA, PE films, or glass plates.

Preferably, the coated substrates in accordance with the present invention are plane, but also structured substrates like e.g. Fresnel lenses can be used.

It is also possible to put a second substrate on top of the coated material prior to and/or during and/or after polymerization. The substrates can be removed after polymerization or not. When using two substrates, at least one substrate has to be transmissive for the actinic radiation used for the polymerization. Isotropic or birefringent substrates can be used. In case the substrate is not removed from the polymer film after polymerization, preferably isotropic substrates are used.

In another preferred embodiment, the polymerizable liquid-crystalline material can also be filled into a prepared cell comprising a pair of opposing substrates. In a preferred embodiment, the substrates are arranged with a separation of at least 1 μm from one another, preferably at least 2 μm from another, and more preferably at least 3 μm from another, where the layer of the liquid-crystalline medium is located in the interspace. Suitable filling methods are, for example, flow filling, capillary filling, etc.

The substrate layers can be kept at a defined separation from one another by, for example, spacers, or projecting structures in the layer. Typical spacer materials are commonly known to the expert, as for example spacers made of plastic, silica, epoxy resins, etc.

The curing step according to the present invention is preferably performed by exposing the polymerizable liquid-crystalline material to linear polarized actinic radiation while being in its nematic phase or isotropic phase, preferably in its nematic phase.

Actinic radiation means irradiation with light, preferably UV light or IR light. In the process according to this invention, the radiation wavelength should be selected such that it causes dissociation of the dichroic photoinitiator and polymerization of the polymerizable compounds. In this regard, curing step is preferably performed by exposing the polymerizable liquid-crystalline material to linear polarised UV radiation.

The radiation wavelength can be adjusted by UV band pass filters. The irradiation wavelength is preferably in the range from 250 nm to 450 nm, more preferably in the range from 320 nm to 390 nm. Especially preferred is an irradiation wavelength of about 365 nm.

As a source for UV radiation, for example a single UV lamp or a set of UV lamps can be used. When using a high lamp power the curing time can be reduced. Another possible source for UV radiation is a laser.

By combining two or more point or linear source UV lamps such that the exposure is incident upon the surface and constructive and destructive interference of the light occurs, it is possible to position the lamps to obtain intensity patterns commonly known as interference patterns. This pattern can be replicated/recorded in the obtained polymer film, either as a variation in birefringence or optic axis, either as planar or tilt patterning.

The linear polarisation of the actinic radiation can be achieved by methods known to the expert. Preferably, the linear polarisation is achieved by passing the radiation through a suitable linear polarizer, such as, for example, a commercially available wire grid polariser (WGP).

The curing step according to the present invention can be performed under an inert gas atmosphere, preferably in a (heated) nitrogen atmosphere, however, curing in air is also possible.

As described above, the polymerizable liquid-crystalline material used in the present invention comprises a dichroic photoinitiator. Like common photoinitiators, dichroic photoinitiators dissociate when exposed to the correct wavelength and the formed radicals will initiate polymerization of monomers. The dichroic photoinitiator used in the polymerizable liquid-crystalline material of the present invention has the property that the light absorption is dependent on the molecular orientation of the molecule. Therefore, when illuminated with said linear polarised UV light, polymerization-initiating free radicals are predominantly produced where the local director lies parallel to the direction of polarisation. The local free-radical production results in different local polymerization rates of the polymerizable liquid-crystalline material in the isotropic, nematic or smectic phase, or chiral variants thereof. The polymerization rate of the liquid-crystalline molecules orientated parallel to the electric field of the linear polarized light proceeds faster than the polymerization of the liquid-crystalline molecules orientated perpendicular to the electric field of the linear polarized light. As a result, the differences in the polymerization rate prioritise director orientation parallel to the linear polarized UV light and finally induce, due to complete polymerization and uniform alignment of the liquid-crystalline material in the polymer film, birefringence into the polymer film.

The curing time is dependent, inter alia, on the reactivity of the polymerizable liquid-crystalline material, the thickness of the coated layer, the type of polymerization initiator and the power of the UV lamp. The curing time is preferably ≤5 minutes, very preferably ≤3 minutes, most preferably ≤1 minute. For mass production, short curing times of ≤30 seconds are preferred.

A suitable UV radiation power is preferably in the range from 5 to 200 mWcm$^{-2}$, more preferably in the range from 10 to 175 mWcm$^{-2}$ and most preferably in the range from 15 to 150 mWcm$^{-2}$.

In connection with the applied UV radiation and as a function of time, a suitable UV dose is preferably in the range from 25 to 7200 mJcm$^{-2}$ more preferably in the range from 500 to 7200 mJcm$^{-2}$ and most preferably in the range from 3000 to 7200 mJcm$^{-2}$.

In a preferred embodiment, the curing step according to the present invention is preferably performed by exposing distinct parts of the layer polymerizable liquid-crystalline material to linear polarized actinic radiation.

This can be achieved, for example,
- by masking techniques, which are commonly known to the expert, like for example by using a photo-mask, preferably a slit mask, or
- by continuously or stepwise moving of the substrate, such as, rotary motion (cf. FIG. 1 and FIG. 6) or horizontal motion (cf. FIG. 8) of the substrate provided with the layer of the polymerizable liquid-crystalline material with respect to the radiant source or the incident radiation beam.

Using an example, the principal of method of the present invention can be illustrated. At the same time, the example also shows a first preferred embodiment of the method according to the invention, without limiting the scope of the invention to this particular example.

Preferably, the liquid-crystalline molecules in the polymer film are aligned into planar orientation concerning the substrate main plane. This planar orientation of the liquid-crystalline molecules in the resulting polymer film can be achieved, if the radiant source in curing step is located at an angle perpendicular to the substrate main plane.

Figure 1:
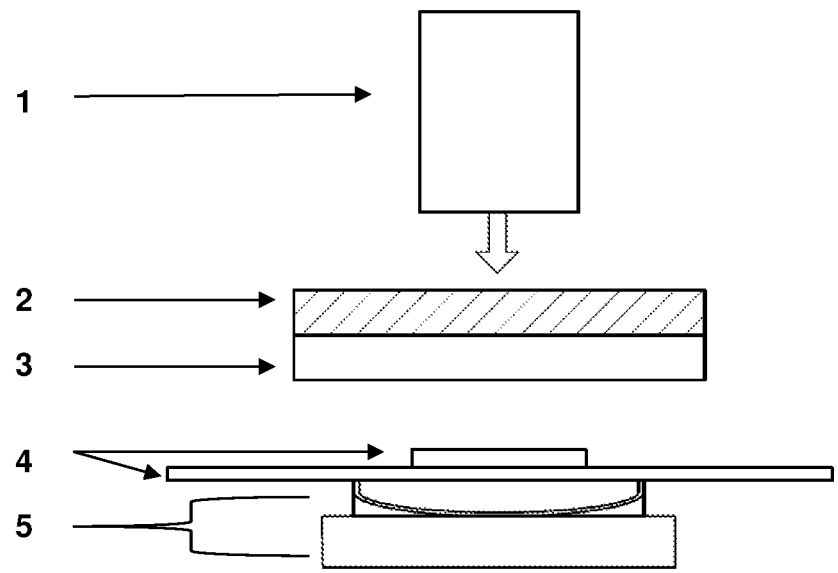
FIG. 1-8 represents production set ups and resultant films according to the invention.

A typical setup for the method of production in accordance with the present invention is depicted in FIG. 1, and comprises:
- a light source (1), which is located perpendicular with regards to the substrate main plane,
- optionally, means for collimating the light beam,
- a rotatable linear polarizer (2),
- a rotatable photo mask (3),
- a substrate (4), provided with a layer of the polymerizable liquid-crystalline medium, and
- a heating source (5) adjacent to the substrate, which is provided on a rotatable stage (6).
    In one preferred embodiment, the substrate (4), provided with a layer of the polymerizable liquid-crystalline medium, and the heating source (5) adjacent to the substrate is stepwise or continuously rotated horizontally around the axis perpendicular with regards to the main plane, while at the same time, both the linear polarizer and the photo mask are fixed in their orientation. Consequently, only those parts of the layer of the polymerizable liquid-crystalline medium will be irradiated with linear polarized light, which are not masked by the photo mask, while the direction of the electric field vector of the linear polarized light stays the same during the complete curing step.

In another preferred embodiment, both, the photo mask (3) and the linear polarizer (2) are stepwise or continuously rotated horizontally around the axis vertical concerning their main plane, while at the same time the orientation of the substrate with the layer of the polymerizable liquid-crystalline material orientation of the linear polarizer is fixed. Consequently, only those parts of the layer of the polymerizable liquid-crystalline medium will be irradiated with linear polarized light, while the direction of the electric field vector of the linear polarized light is varied during the complete curing step.

By adjusting the orientation of the wire grid polarizer with respect to the slit mask (cf. FIGS. 2 and 4), either radial aligned polymer films (FIG. 3) or concentric aligned polymer films (FIG. 5) can be obtained from the above described method according to the present invention.

Using another example, the principal of method of the present invention can be illustrated. At the same time, this example also shows a second preferred embodiment of the method according to the invention, without limiting the scope of the invention to this particular example.

Figure 6:
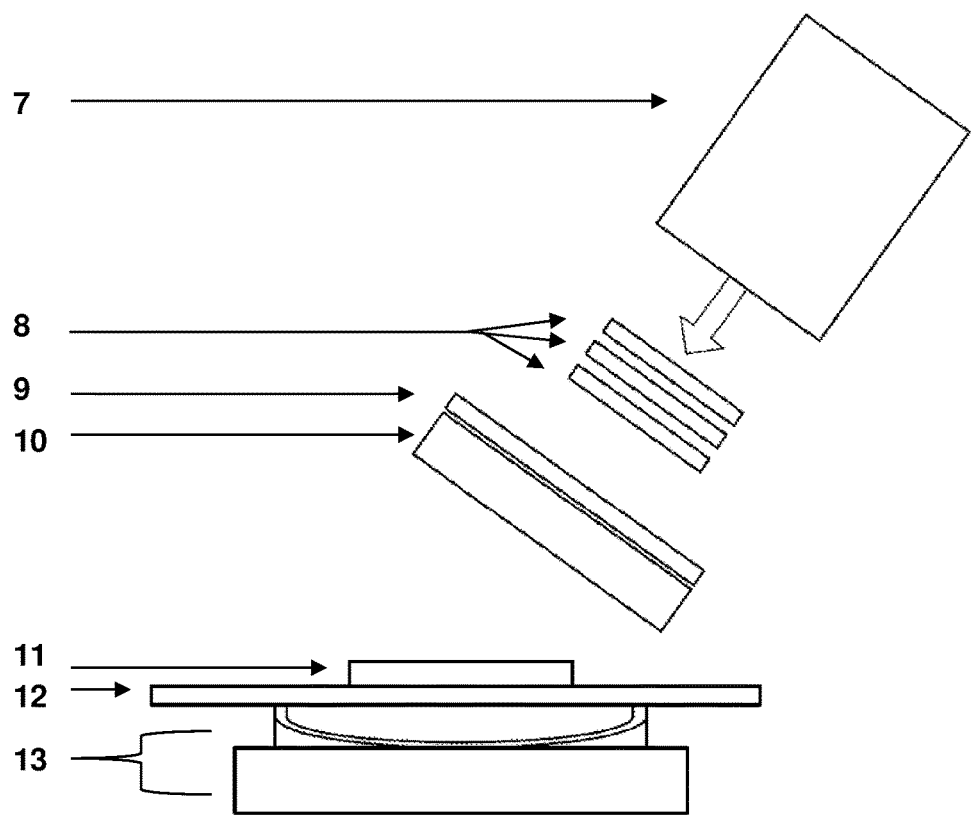

Another typical setup for the method of production in accordance with the present invention is depicted in FIG. 6, and comprises:

a light source (7), which is located at an oblique angle (>0°<90°) with regards to the substrate main plane
optionally, means for collimating the light beam (8),
a linear polarizer (9) and a photo mask (10) which are located in front of the light source at the same oblique angle (>0°<90°),
a substrate (11), provided with a layer of the polymerizable liquid-crystalline medium, and
a heating source (12) adjacent to the substrate, which is provided on a rotatable stage (13).

In one preferred embodiment, the substrate (11), provided with a layer of the polymerizable liquid-crystalline medium, and the heating source (12) adjacent to the substrate is continuously rotated horizontally around the axis vertical with regards to the main plane, while at the same time, both, the linear polarizer and the light source are fixed in their orientation .

Figure 7:
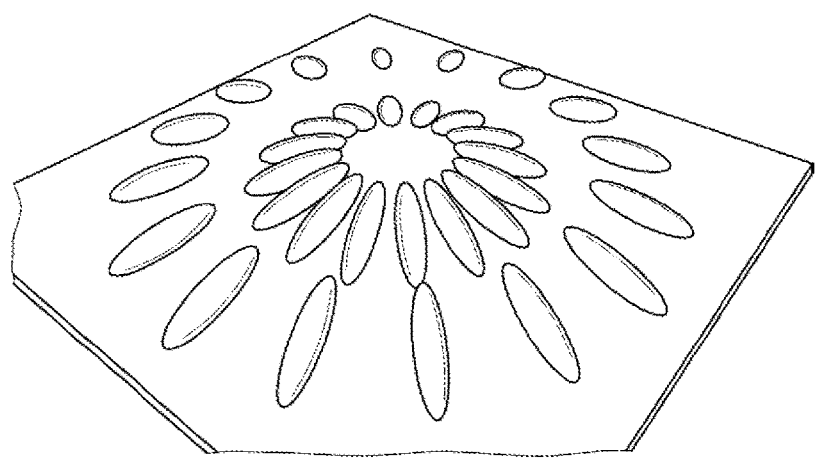
Figure 8:
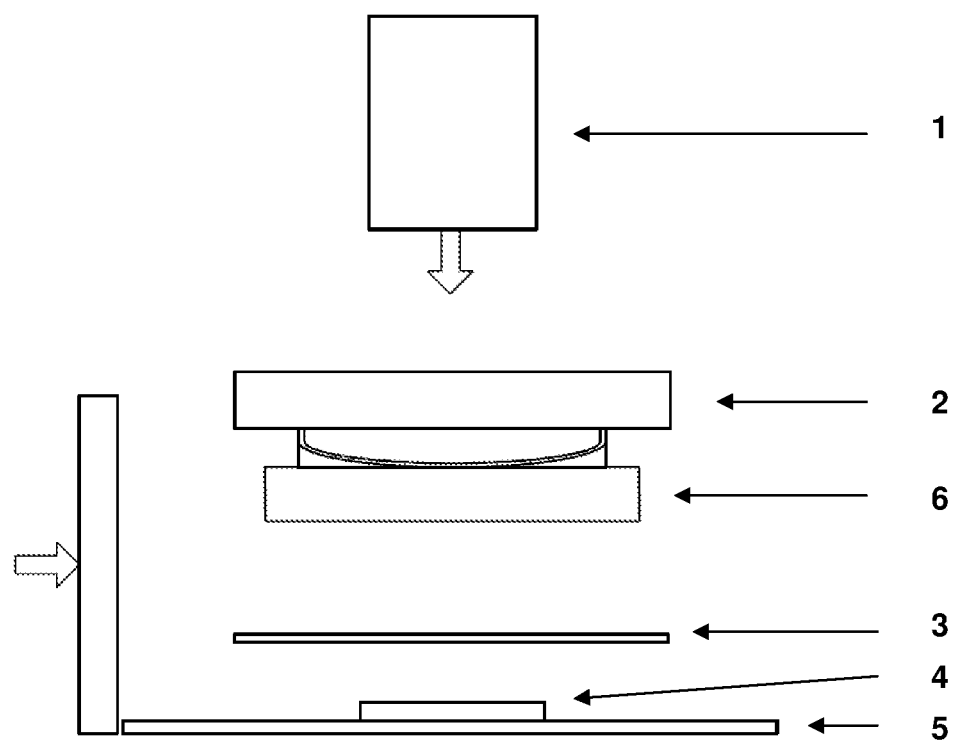

In another preferred embodiment, both the linear polarizer and the light source are rotated on a circular path above the substrate (11), provided with a layer of the polymerizable liquid-crystalline medium Following one of the above- described procedures, it is possible to produce a polymer film wherein the liquid-crystalline material is generally aligned into a tilted radial orientation (>0°<90°) concerning the substrate main plane (FIG. 7).

Preferably, the irradiation angle is between >0° and <90°, more preferable between >10° and <80°, or even more preferable between >20° and <70°, especially between >30° and <60°, and in particular about 45°.

The present invention also relates to a polymer film obtainable or obtained by the method described above and below.

However, it is likewise preferred that the oriented polymer films of the present invention are used as retardation or compensation films, for example in LCDs to improve the contrast and brightness at large viewing angles and reduce the chromaticity. They can be used outside the switchable liquid-crystalline cell in an LCD, or between the substrates, usually glass substrates, forming the switchable liquid-crystalline cell and containing the switchable liquid-crystalline medium (incell application).

Various types of optical retarders are known. For example, an "A film" (or A-plate) is an optical retarder utilizing a layer of uniaxially birefringent material with its extraordinary axis oriented parallel to the plane of the layer. In this connection, an "C film" (or C-plate) is an optical retarder utilizing a layer of uniaxially birefringent material with its extraordinary axis perpendicular to the plane of the layer. However also patterned or tilted variants of the above described retarders are in accordance with the with the present invention Depending on the irradiation angle described above, the polymer film obtainable or obtained by the method according to the present invention can either be used as an patterned A-plate (at least two different planar orientations of the director of the liquid-crystalline molecules of the polymer film), if the radiant source in the curing step is located at an angle perpendicular to the substrate main plane, or as an patterned O-plate (at least two different tilted orientations of the director of the liquid-crystalline molecules in the polymer film) if the radiant source is located at an oblique angle (>0°<90°) with regards to the substrate main plane.

In another preferred embodiment, the polymer film obtainable or obtained by the method according to the present invention can also be used as a flat surface lens, exhibiting both concave or convex type director orientations, or gradient refractive index lens (GRIN), which both can be used for autostereoscopic display devices.

The optical retardation ($\delta(\lambda)$) of a polymer film as a function of the wavelength of the incident beam ($\lambda$) is given by the following equation (6):

$$\delta(\lambda)=(2\pi\Delta n \cdot d)/\lambda \quad (6)$$

wherein ($\Delta n$) is the birefringence of the film, (d) is the thickness of the film and $\lambda$ is the wavelength of the incident beam.

According to Snellius law, the birefringence as a function of the direction of the incident beam is defined as $$\Delta n = \sin \Theta / \sin \Psi \quad (7)$$

wherein $\sin \Theta$ is the incidence angle or the tilt angle of the optical axis in the film and $\sin \Psi$ is the corresponding reflection angle.

Based on these laws, the birefringence and accordingly optical retardation depends on the thickness of a film and the tilt angle of optical axis in the film (cf. Berek's compensator). Therefore, the skilled expert is aware that different optical retardations or different birefringence can be induced by adjusting the orientation of the liquid-crystalline molecules in the polymer film.

The birefringence ($\Delta n$) of the polymer film according to the present invention is preferably in the range from 0.01 to 0.30, more preferable in the range from 0.01 to 0.25 and even more preferable in the range from 0.01 to 0.16.

The thickness of the polymer film obtained by the method according to the present invention is preferably in the range from 3 to 30 μm, more preferable in the range from 3 to 20 μm and even more preferable in the range from 3 to 10 μm.

In a preferred embodiment, the thickness of the polymer film is such that a phase change of $\pi/2$ is introduced, then the resulting exiting beam will be circularly polarized. Since $\pi/2$ is equivalent to a quarter of a wave, this retarder is referred to as a quarter waveplate. The quarter waveplate as previously explained will change linear polarization to circular and vice-versa.

In a likewise preferred embodiment, the thickness of the polymer film is such that a phase change of π is introduced, which corresponds to a half waveplate. Halfwaveplates keep linear polarization linear, however it will be rotated through an angle of 2θ; where θ is the angle between the incident polarization direction and the materials fast axis.

In another preferred embodiment, the thickness of the polymer film is such that a change in retardance of one wave (2π) is equivalent to no change in retardance and entrance beam.

The polymer film of the present invention can also be used as alignment film for other liquid-crystalline or RM materials as described, for example, in WO 2006/039980 A1. For example, they can be used in an LCD to induce or improve alignment of the switchable liquid-crystalline medium, or to align a subsequent layer of polymerizable liquid-crystalline material coated thereon. In this way, stacks of polymerized liquid-crystalline films can be prepared.

The polymer films of the present invention can be used in various types of liquid-crystalline displays, for example displays with vertical alignment like the DAP (deformation of aligned phases), ECB (electrically controlled birefringence), CSH (colour super homeotropic), VA (vertically aligned), VAN or VAC (vertically aligned nematic or cholesteric), MVA (multi-domain vertically aligned) or PVA (patterned vertically aligned) mode; displays with bend or hybrid alignment like the OCB (optically compensated bend cell or optically compensated birefringence), R-OCB (reflective OCB), HAN (hybrid aligned nematic) or pi-cell (π-cell) mode; displays with twisted alignment like the TN (twisted nematic), HTN (highly twisted nematic), STN (super twisted nematic), AMD-TN (active matrix driven TN) mode; displays of the IPS (in plane switching) mode, or displays with switching in an optically isotropic phase.

The present invention is described above and below with particular reference to the preferred embodiments. It should be understood that various changes and modifications might be made therein without departing from the spirit and scope of the invention.

Many of the compounds or mixtures thereof mentioned above and below are commercially available. All of these compounds are either known or can be prepared by methods which are known per se, as described in the literature (for example in the standard works such as Houben-Weyl, Methoden der Organischen Chemie [Methods of Organic Chemistry], Georg-Thieme-Verlag, Stuttgart), to be precise under reaction conditions which are known and suitable for said reactions. Use may also be made here of variants which are known per se, but are not mentioned here. Unless the context clearly indicates otherwise, as used herein plural forms of the terms herein are to be construed as including the singular form and vice versa.

Throughout this application, unless explicitly stated otherwise, all concentrations are given in weight percent and relate to the respective complete mixture, all temperatures are given in degrees centigrade (Celsius) and all differences of temperatures in degrees centigrade. All physical properties have been and are determined according to "Merck Liquid Crystals, Physical Properties of Liquid Crystals", Status November 1997, Merck KGaA, Germany and are given for a temperature of 20° C., unless explicitly stated otherwise. The optical anisotropy (Δn) is determined at a wavelength of 589.3 nm.

Throughout the description and claims of this specification, the words "comprise" and "contain" and variations of the words, for example "comprising" and "comprises", mean "including but not limited to", and are not intended to (and do not) exclude other components. On the other hand, the word "comprise" also encompasses the term "consisting of" but is not limited to it.

Throughout the description and claims of this specification, the words "obtainable" and "obtained" and variations of the words, mean "including but not limited to", and are not intended to (and do not) exclude other components. On the other hand, the word "obtainable" also encompasses the term "obtained" but is not limited to it.

It will be appreciated that variations to the foregoing embodiments of the invention can be made while still falling within the scope of the invention. Alternative features serving the same, equivalent, or similar purpose may replace each feature disclosed in this specification, unless stated otherwise. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following working examples, which are illustrative only and do not limit the scope of the invention.

EXAMPLES

1. Mixture Examples
1.1 Mixture M1
The following polymerizable liquid-crystalline material is prepared

| Compound | Amount [% w/w] |
|---|---|
| (structure shown) | 62.82 |

-continued

| Compound | Amount [% w/w] |
|---|---|
| [acrylate-O-(CH₂)₆-O-phenyl-COO-phenyl-CN] | 11.00 |
| [acrylate-O-(CH₂)₆-O-phenyl-COO-phenyl(Cl)-C≡C-phenyl-OCH₃] | 8.00 |
| [C₅H₁₁-phenyl-phenyl(F)-phenyl-phenyl-CO-C(CH₃)₂-N-morpholine] | 8.00 |
| [binaphthyl-dioxy-CH₂-CH-O-CO-phenyl-phenyl-O-acrylate] | 8.00 |
| [acrylate-O(CH₂)₃O-phenyl-COO-phenyl(CH₃)-OCO-phenyl-O(CH₂)₃-O-acrylate] | 2.00 |
| TegoRad 2500 | 0.10 |
| Irganox 1076 ® (stabilizer) | 0.08 |

Clearing point: 40.0° C.

1.2. Mixture M2

The following polymerizable liquid-crystalline material is prepared

| Compound | Amount [% w/w] |
|---|---|
| [acrylate-O-(CH₂)₆-O-phenyl-COO-phenyl-OCH₃] | 62.82 |
| [acrylate-O-(CH₂)₆-O-phenyl-COO-phenyl-CN] | 11.00 |
| [acrylate-O-(CH₂)₆-O-phenyl-COO-phenyl(Cl)-C≡C-phenyl-OCH₃] | 8.00 |

| Compound | Amount [% w/w] |
|---|---|
| 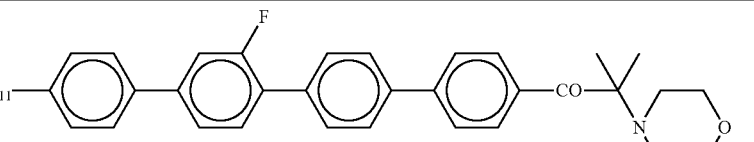 | 8.00 |
|  | 8.00 |
| 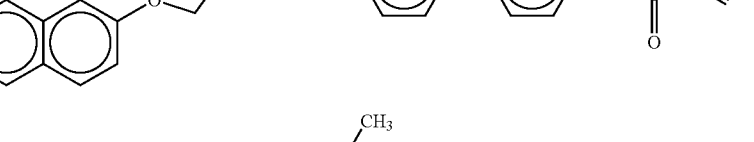 | 2.00 |
| TegoRad 2500 | 0.10 |
| Irganox 1076 ® (stabilizer) | 0.08 |
Clearing Point 48.7° C.
1.3. Mixture M3
The following polymerizable liquid-crystalline material is prepared
| Compound | Amount [% w/w] |
|---|---|
| 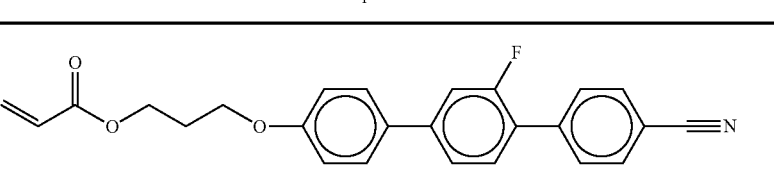 | 10.00 |
| 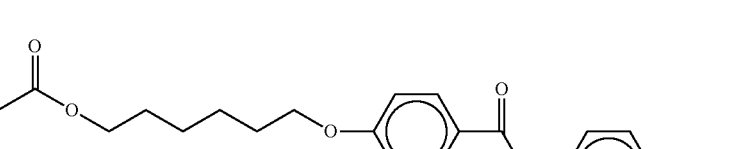 | 54.31 |
| 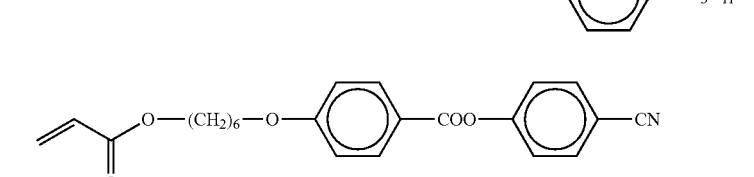 | 9.51 |
| 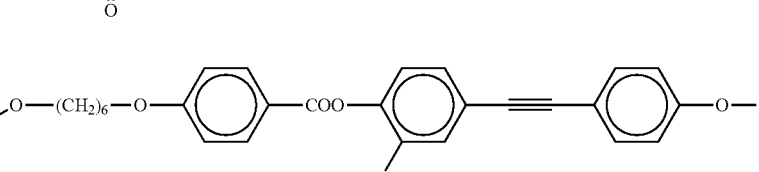 | 8.00 |

-continued

| Compound | Amount [% w/w] |
|---|---|
| 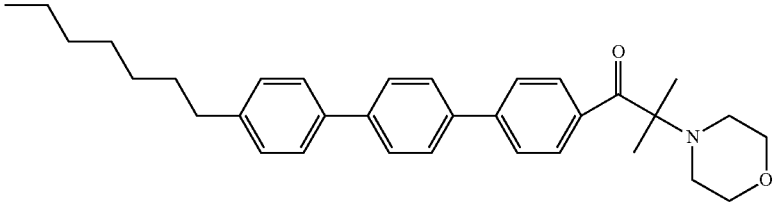 [SMILES: CCCCCCCc1ccc(-c2ccc(-c3ccc(C(=O)C(C)(C)N4CCOCC4)cc3)cc2)cc1] | 8.00 |
| 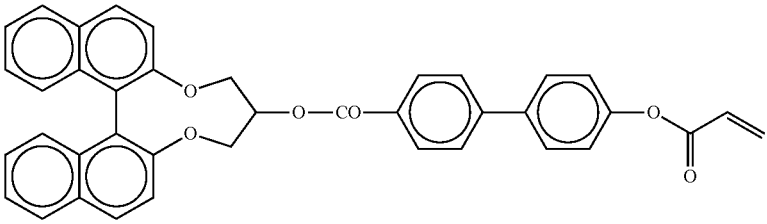 | 8.00 |
| 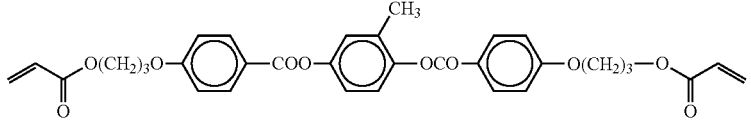 | 2.00 |
| TegoRad 2500 | 0.10 |
| Irganox 1076 ® (stabilizer) | 0.08 |

Clearing Point: 43.5° C.

2. Cell Production

5 μm spacer beads are mixed with Norland81 UV glue. The cell is created by placing drops of glue/beads mixture onto corners of raw glass slide, providing a second raw glass slide down on top, and then curing for 60 seconds with UV light (25 mW).

3. Radial Alignment

Figure 2:
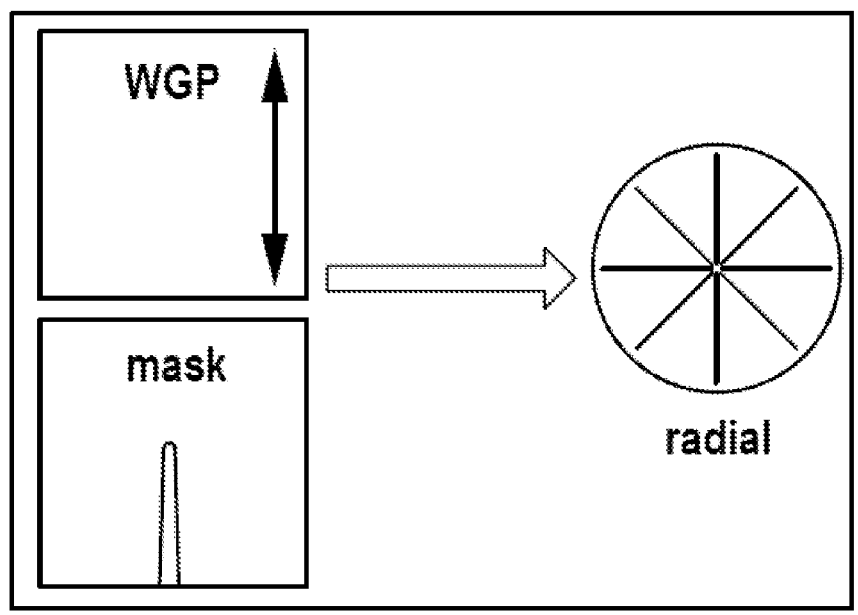
Figure 3:
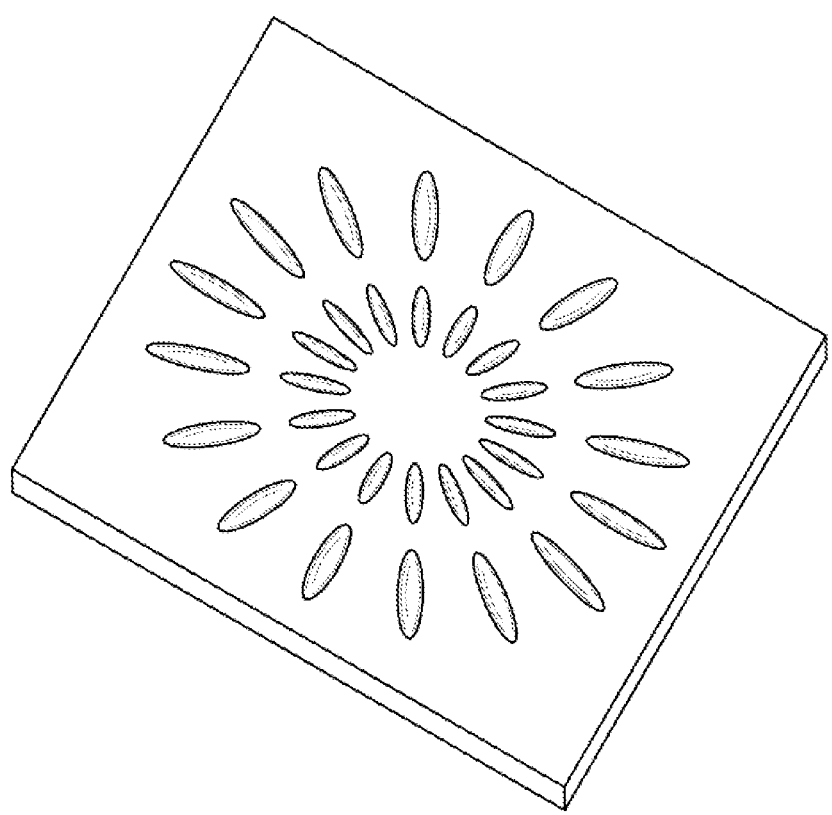

Mixture M3 is flow-filled in to the cell on a hotplate at 80° C. The temperature is then adjusted to 60° C. for 60 seconds. The cell is placed on the motorized rotation stage and the rotation speed is set to 3° per seconds. For a radial alignment, the WGP is set to be parallel with respect to the slit of the slit mask (FIG. 2). The cell is then exposed to polarised UV light (365 nm bandpass filter) with 25 mW for 60 seconds under air at 60° C. The mixture M3 gives a clear, transparent polymer film with good radial orientation (cf. FIG. 3).

In the same manner clear, transparent polymer films with good radial orientation can be prepared from the mixtures M1 and M2.

3.1 Radial Alignment

Mixture M3 is spin-coated onto raw glass at 1000 rpm for 30 sec. The film is placed on a hotplate at 56° C. for 60 seconds. The film is then placed into a nitrogen chamber at 34° C. for 60 seconds while the chamber is purged with nitrogen. The chamber is is placed on the motorized rotation stage and the rotation speed is set to 3° per seconds. For a radial alignment, the WGP is set to be parallel with respect to the slit of the slit mask (FIG. 2). The cell is then exposed to polarised UV light (365 nm bandpass filter) with 120 mW for 40 seconds under nitrogen at 34° C. The mixture M3 gives a clear, transparent polymer film with good radial orientation (cf. FIG. 3).

4. Concentric Alignment

Figure 4:
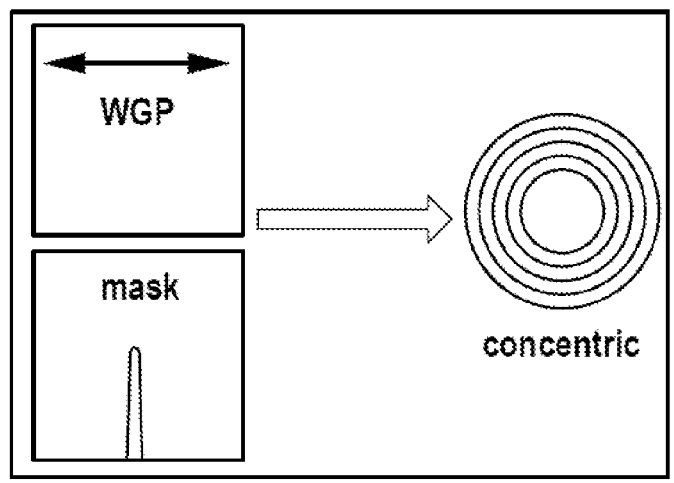
Figure 5:
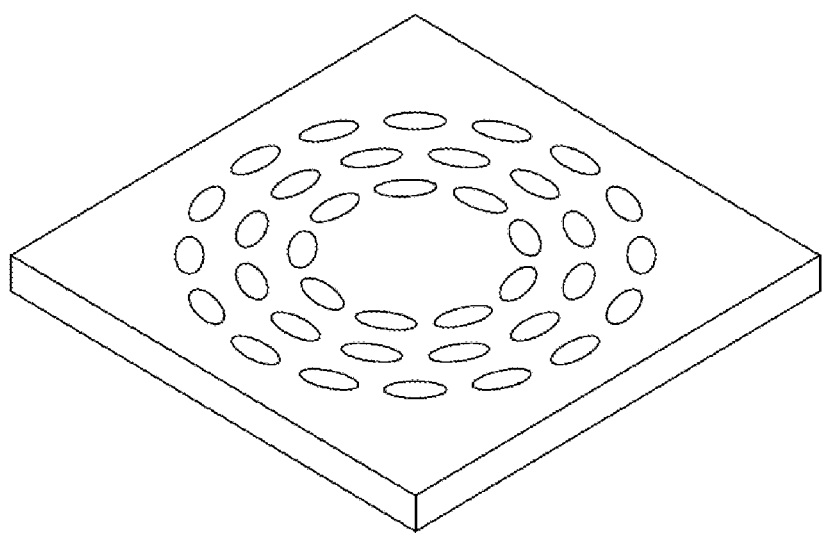

Mixture M3 is flow-filled in to the cell on a hotplate at 80° C. The temperature is then adjusted to 60° C. for 60 seconds. The cell is placed on the motorized rotation stage and the rotation speed is set to 3° per seconds. For a radial alignment, the WGP is set to be perpendicular with respect to slit of the slit mask (FIG. 4). The cell is then exposed to polarised UV light (365 nm bandpass filter) with 25 mW for 60 seconds under air at 60° C. The mixture M3 gives a clear, transparent polymer film with good concentric orientation (cf. FIG. 5).

In the same manner clear, transparent polymer films with good concentrical orientation can be prepared from the mixtures M1 and M2.

5. Tilted Radial Alignment

Mixture M3 is flow-filled in to the cell on a hotplate at 80° C. The temperature is then adjusted to 60° C. for 60 seconds. The cell is placed on the motorized rotation stage and the rotation speed is set to 3° per seconds. The UV lamp is set at an oblique angle of 45° with regards to the cell main plane. The WGP is set to be parallel with respect to the slit of the slit mask (FIG. 2). The cell is then exposed to polarised UV light (365 nm bandpass filter) with 25 mW for 60 seconds under air at 60° C. The mixture M3 gives a clear, transparent polymer film with a good orientation in form of a convex orientation (cf. FIG. 7).

In the same manner clear, transparent and flat types lenses film with a good orientation in form of a convex orientation can be prepared from the mixtures M1 and M2.

The invention claimed is:

1. A method of preparing a patterned polymer film comprising:
    a) providing a layer of a polymerizable liquid-crystalline material comprising at least one dichroic photoinitiator, and at least one chiral compound, onto a substrate, b) adjusting the temperature of the polymerizable liquid-crystalline material to a temperature, where the polymerizable liquid-crystalline material is in its nematic or isotropic phase, c) polymerizing and orientating by irradiating the polymerizable liquid-crystalline material with linear polarized actinic radiation, varying the angle between the layer of the polymerizable liquid-crystalline material or the direction of the electric field vector of the linear polarized actinic radiation, thereby causing the polymerizable liquid-crystalline material to form a polymer film, and d) optionally removing the polymer film from the substrate.

2. The method according to claim 1, wherein in c), the liquid-crystalline material is irradiated, while being in the nematic phase.

3. The method according to claim 1, wherein c) is performed while continuously or stepwise rotating the substrate with the layer of a polymerizable liquid-crystalline material.

4. The method according to claim 1, wherein c) is performed by continuously or stepwise rotating a photo mask or a linear polarizer or both, each located between the substrate and a light source.

5. The method according to claim 1, wherein the polymerizable liquid-crystalline material comprises at least one mono-, di- or multireactive polymerizable mesogenic compound, at least one chiral compound, and at least one dichroic photoinitiator.

6. The method according to claim 1, wherein the polymerizable liquid-crystalline material comprises at least one monoreactive polymerizable mesogenic compound, at least one di- or multireactive polymerizable mesogenic compound, at least one chiral compound, and at least one dichroic photoinitiator.

7. The method according to claim 1, wherein the polymerizable liquid-crystalline material comprises at least one monoreactive chiral polymerizable mesogenic compound, at least one mono-, di- or multireactive achiral polymerizable mesogenic compound, and at least one dichroic photoinitiator.

8. The method according to claim 1, wherein the polymerizable liquid-crystalline material comprises at least one di- or multireactive chiral polymerizable mesogenic compound, at least one mono-, di- or multireactive achiral polymerizable mesogenic compound, and at least one dichroic photoinitiator.

9. The method according to claim 1, wherein the polymerizable liquid-crystalline material comprises at least one non-polymerizable chiral compound, at least one mono-, di- or multireactive achiral polymerizable mesogenic compound and at least one dichroic photoinitiator.

10. The method according to claim 1, wherein the dichroic photoinitiator is a compound of formula I,

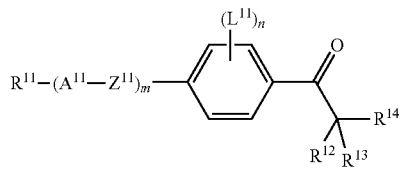

I wherein

P is a polymerizable group,

Sp is a spacer group or a single bond, $A^{11}$ is in case of multiple occurrence independently of one another an aryl-, heteroaryl-, aliphatic or heterocyclic group optionally being substituted by one or more identical or different groups L, Z is in each occurrence independently from each other, —O—, —S—, —CO—, —COO—, —OCO—, —S—CO—, —CO—S—, —O—COO—, —CO—NR$^{01}$—, —NR$^{01}$—CO—, -NR$^{01}$—CO—NR$^{02}$, —NR$^{01}$—CO—O—, —O—CO—NR$^{01}$—, —OCH$_2$—, —CH$_2$O—, —SCH$_2$—, —CH$_2$S—, —CF$_2$O—, —OCF$_2$—, —CF$_2$S—, —SCF$_2$—, —CH$_2$CH$_2$—, —(CH$_2$)$_4$—, —CF$_2$CH$_2$—, —CH$_2$CF$_2$—, —CF$_2$CF$_2$—, —CH=N—, —N=CH—, —N=N—, —CH=CR$^{01}$—, —CY$^{01}$=CY$^{02}$—, —C≡C—, —CH=CH—COO—, —OCO—CH=CH—, or a single bond, m is 0, 1, 2 or 3, r is 0, 1, 2, 3 or 4, L is, in case of multiple occurrence independently of one another, H, F, Cl, CN or optionally halogenated alkyl, alkoxy, alkylcarbonyl, alkoxycarbonyl, alkylcarbonyloxy or alkoxycarbonyloxy with 1 to 5C atoms, $R^{11}$ is H, halogen, CN, NO$_2$, NCS, SF$_5$, P-Sp-; or straight chain or branched alkyl with 1 to 20 C-atoms that is optionally mono- or polysubstituted by F, Cl, Br, I or CN, and wherein one or more non-adjacent CH$_2$ groups are optionally replaced, in each case independently from one another, by —O—, —S—, —NR$^{01}$—, —SiR$^{01}$R$^{02}$—, —CO—, —COO—, —OCO—, —OCO—O—, —NR$^{01}$—CO—, —CO—NR$^{01}$—, —NR$^{01}$—CO—NR$^{02}$—, —S—CO—, —CO—S—, —CY$^{01}$=CY$^{02}$— or —C≡C—in such a manner that O and/or S atoms are not linked directly to one another; or $R^{14}$ $R^{12-13}$ are independently of each other H, or straight chain or branched alkyl with 1 to 20 C-atoms that is optionally mono- or polysubstituted by F, Cl, Br, I or CN, and wherein one or more non-adjacent CH$_2$ groups are optionally replaced, in each case independently from one another, by —O—, —S—, —NR$^{01}$—, —SiR$^{01}$R$^{02}$—, —CO—, —COO—, —OCO—, —OCO—O—, —NR$^{01}$—CO—, —CO—NR$^{01}$—, —NR$^{01}$—CO—NR$^{02}$—, —S—CO—, —CO—S—, —CY$^{01}$=CY$^{02}$— or —C≡C —in such a manner that O and/or S atoms are not linked directly to one another, $R^{14}$ denotes —OH, —NR$^{01}$R$^{02}$, or

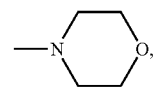

$Y^{01}$ and $Y^{02}$ each, independently of one another, denote H, halogen or CN, and $R^{01}$ and $R^{02}$ are in dependently of each other H, or straight chain or branched alkyl with 1 to 5 C-atoms.

11. The method according to claim 1, wherein the proportion of the dichroic photoinitiator in the liquid-crystalline material as a whole is in the range from 1 to 25% by weight.

12. The method according to claim 1, wherein the chiral compound has a helical twisting power (HTP)≥25 µm$^{-1}$.

13. The method according to claim 1, wherein the proportion of the chiral compound in the liquid-crystalline material as a whole is in the range from 2 to 20% by weight.

14. The method according to claim 1, wherein c) is performed by exposing the polymerizable liquid-crystalline material to linear polarised UV radiation.

15. The method according to claim 1, wherein the polymerizable liquid-crystalline material is has planar orientation concerning the substrate main plane after the irradiation c).

16. The method according to claim 1, wherein the polymerizable liquid-crystalline material has a tilted orientation ($>0°<90°$) concerning the substrate main plane, after the irradiation c).

17. The method according to claim 1, wherein the irradiation in c) is performed at an oblique angle ($>0°<90°$) concerning the substrate main plane.

18. A polymer film obtainable by the method of production according to claim 1.

19. In liquid crystal displays (LCDs) or other optical or electro optical devices, decorative or security applications, or window applications, comprising an alignment layer or optical retardation film, the improvement wherein the layer or film is a polymer film according to claim 18.

20. An optical or electro optical device comprising at least one polymer film according to claim 18.

* * * * *